United States Patent
Tsunoda

(10) Patent No.: US 9,231,706 B2
(45) Date of Patent: Jan. 5, 2016

(54) DRIVE CIRCUIT, OPTICAL TRANSMISSION APPARATUS, DRIVING METHOD, AND OPTICAL TRANSMISSION METHOD

(75) Inventor: Yukito Tsunoda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 810 days.

(21) Appl. No.: 13/099,598

(22) Filed: May 3, 2011

(65) Prior Publication Data
US 2012/0045217 A1 Feb. 23, 2012

(30) Foreign Application Priority Data
Aug. 18, 2010 (JP) ................. 2010-183038

(51) Int. Cl.
*H04B 10/58* (2013.01)
*H03K 3/017* (2006.01)
*H03K 5/156* (2006.01)
*H04B 10/50* (2013.01)

(52) U.S. Cl.
CPC .............. *H04B 10/58* (2013.01); *H03K 5/1565* (2013.01); *H04B 10/504* (2013.01)

(58) Field of Classification Search
CPC ........... H05B 33/0815; H05B 33/0824; H05B 33/0842; H05B 41/3927; H03K 5/1565; H04B 10/04; H04B 10/58; H04B 10/504
USPC .......... 315/291, 293, 297, 307; 327/100, 108, 327/175, 306; 398/182, 188, 202, 210
See application file for complete search history.

(56) References Cited

U.S. PATENT DOCUMENTS

| | | | | |
|---|---|---|---|---|
| 6,897,685 | B2 * | 5/2005 | Sato | 326/86 |
| 7,447,134 | B2 * | 11/2008 | Chou et al. | 369/53.26 |
| 7,812,587 | B2 | 10/2010 | Suzuki et al. | |
| 8,466,719 | B2 * | 6/2013 | Takahara | 327/116 |
| 2007/0291198 | A1 * | 12/2007 | Shen | 349/69 |

FOREIGN PATENT DOCUMENTS

JP 2006-040974 A 2/2006

* cited by examiner

*Primary Examiner* — Thai Pham
(74) *Attorney, Agent, or Firm* — Fujitsu Patent Center

(57) ABSTRACT

A drive circuit includes a duty cycle adjusting circuit that changes the duty cycle of a first signal; and a calculating circuit that with respect to signals that include the first signal for which the duty cycle has been adjusted and a second signal having a phase and amplitude that differ from that of the first signal, performs any one of subtracting one of the signals from the other signal and adding the signals.

14 Claims, 22 Drawing Sheets

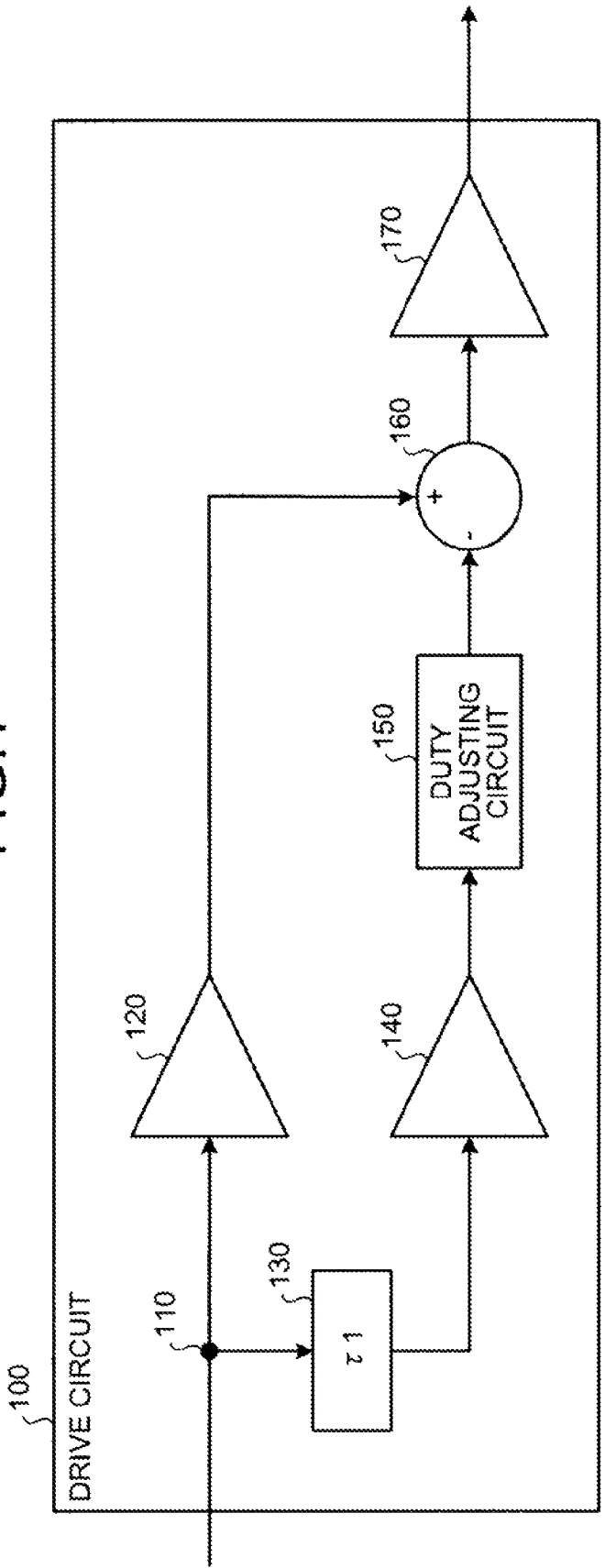

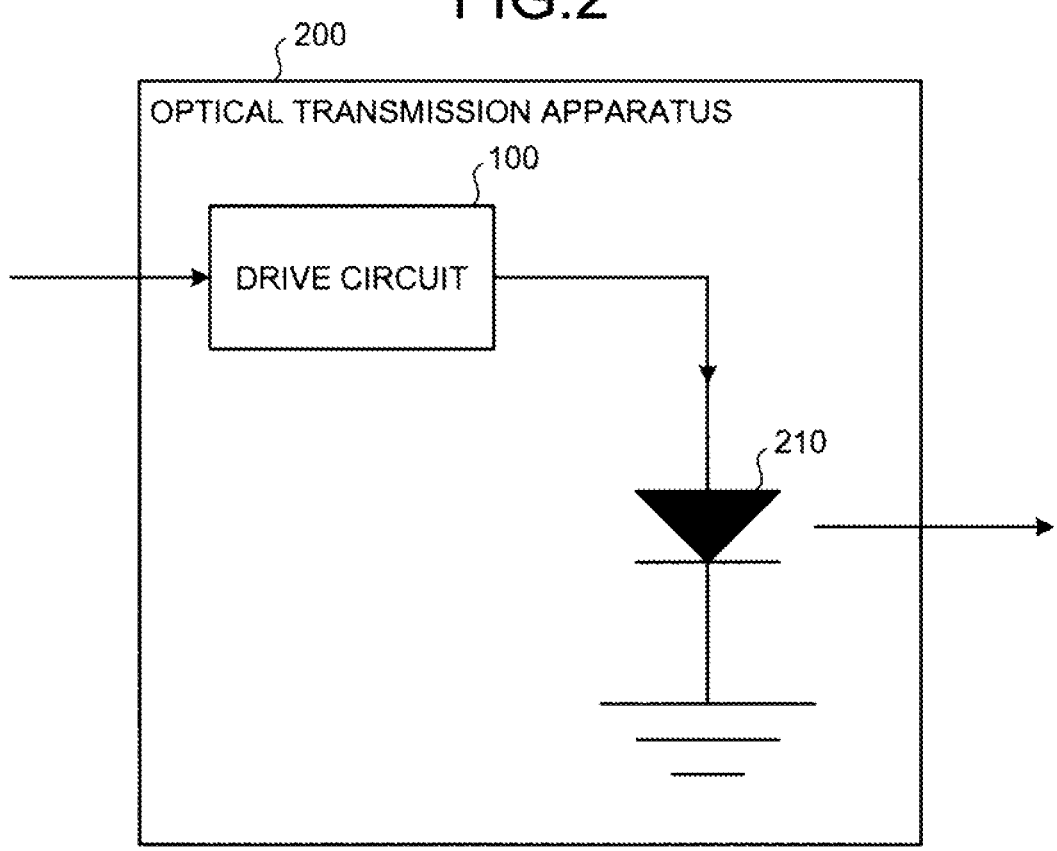

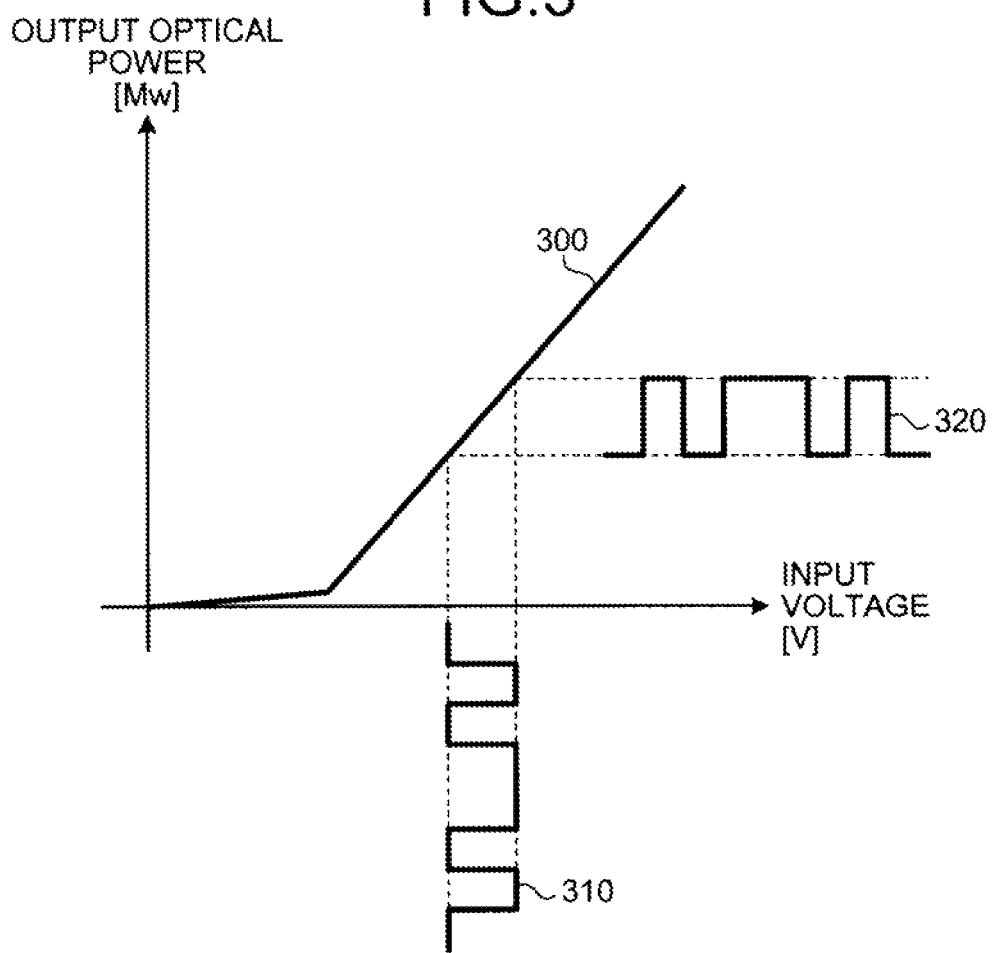

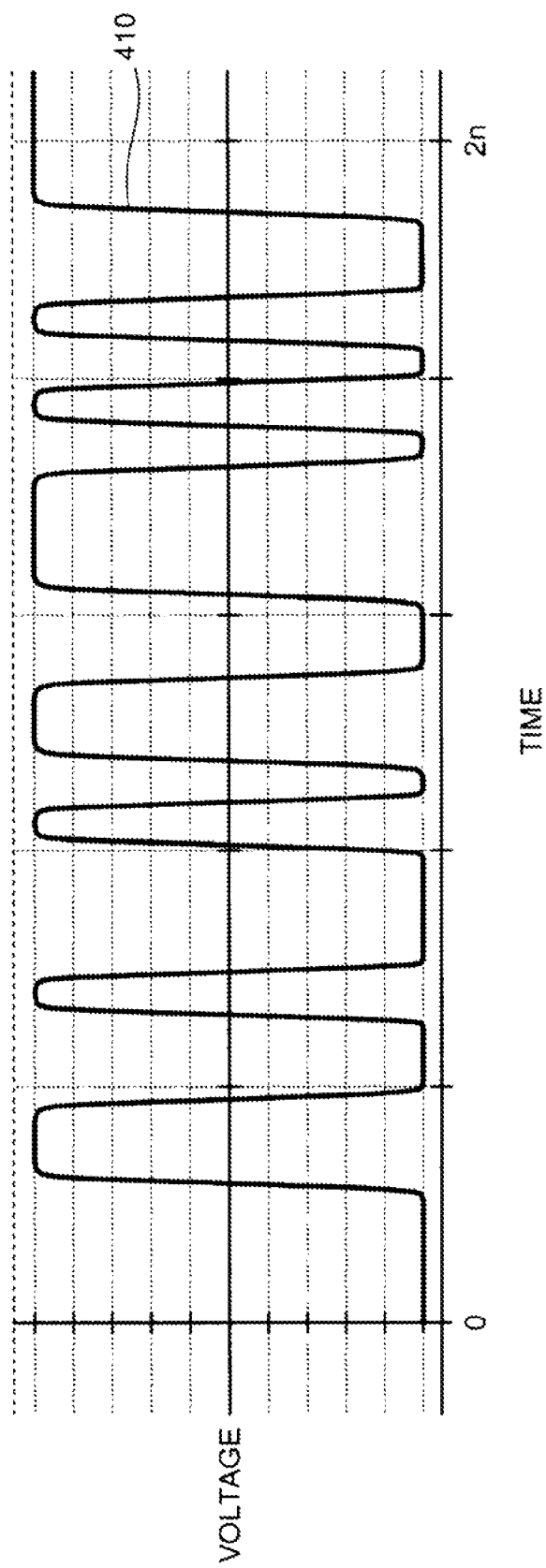

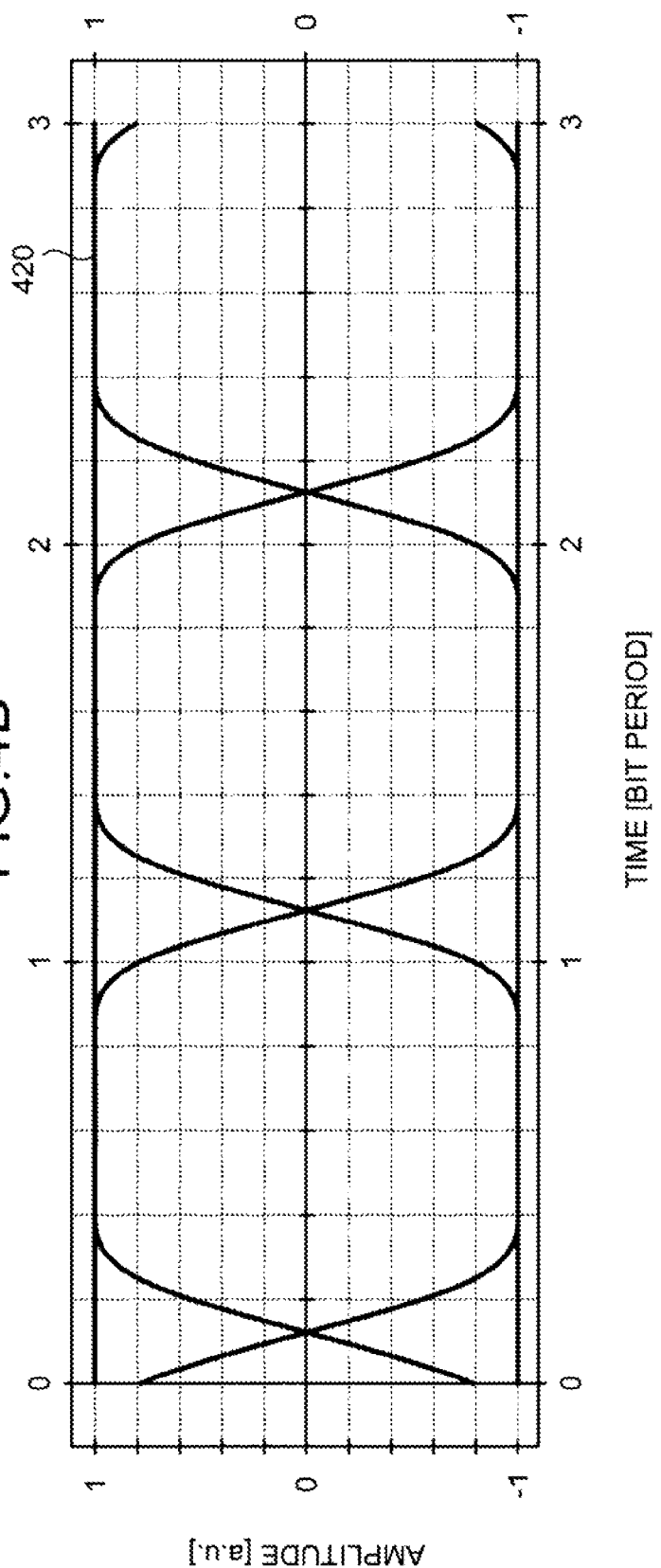

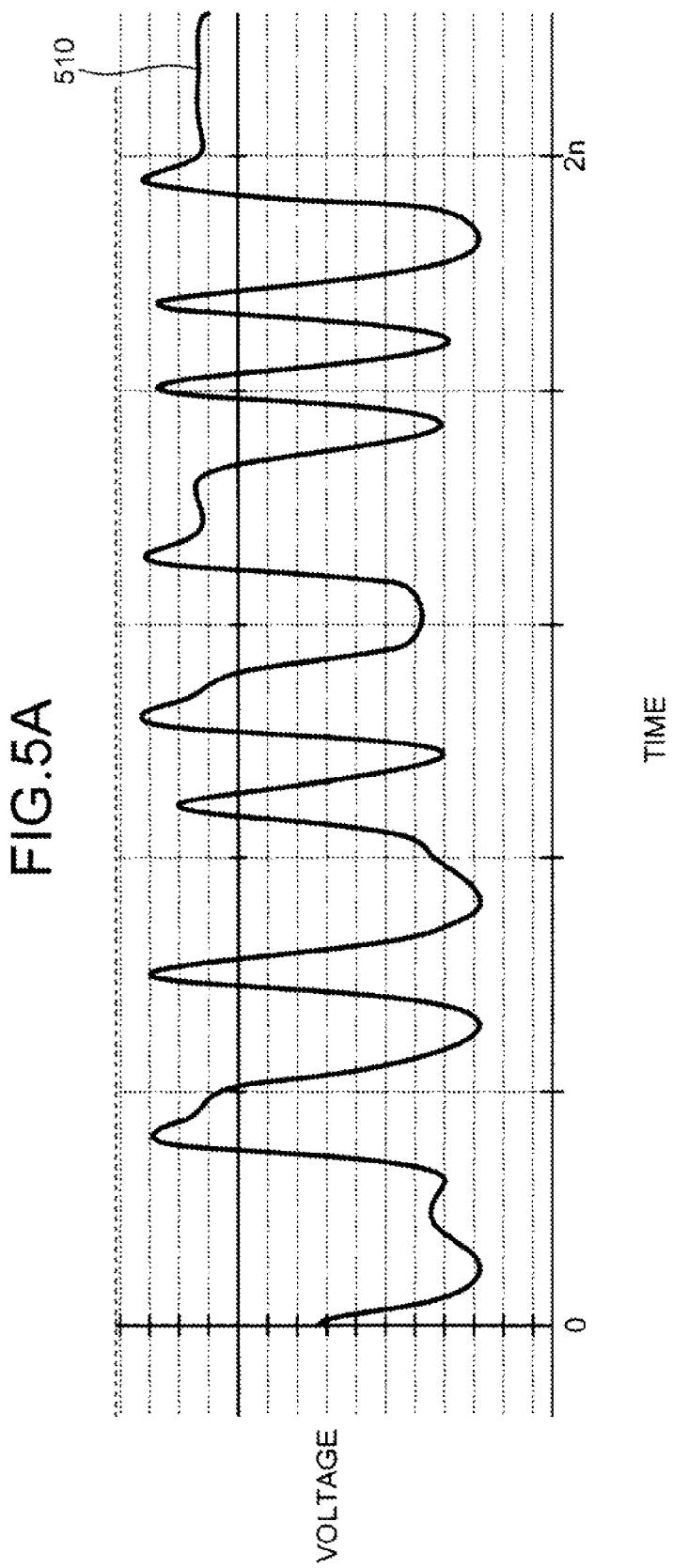

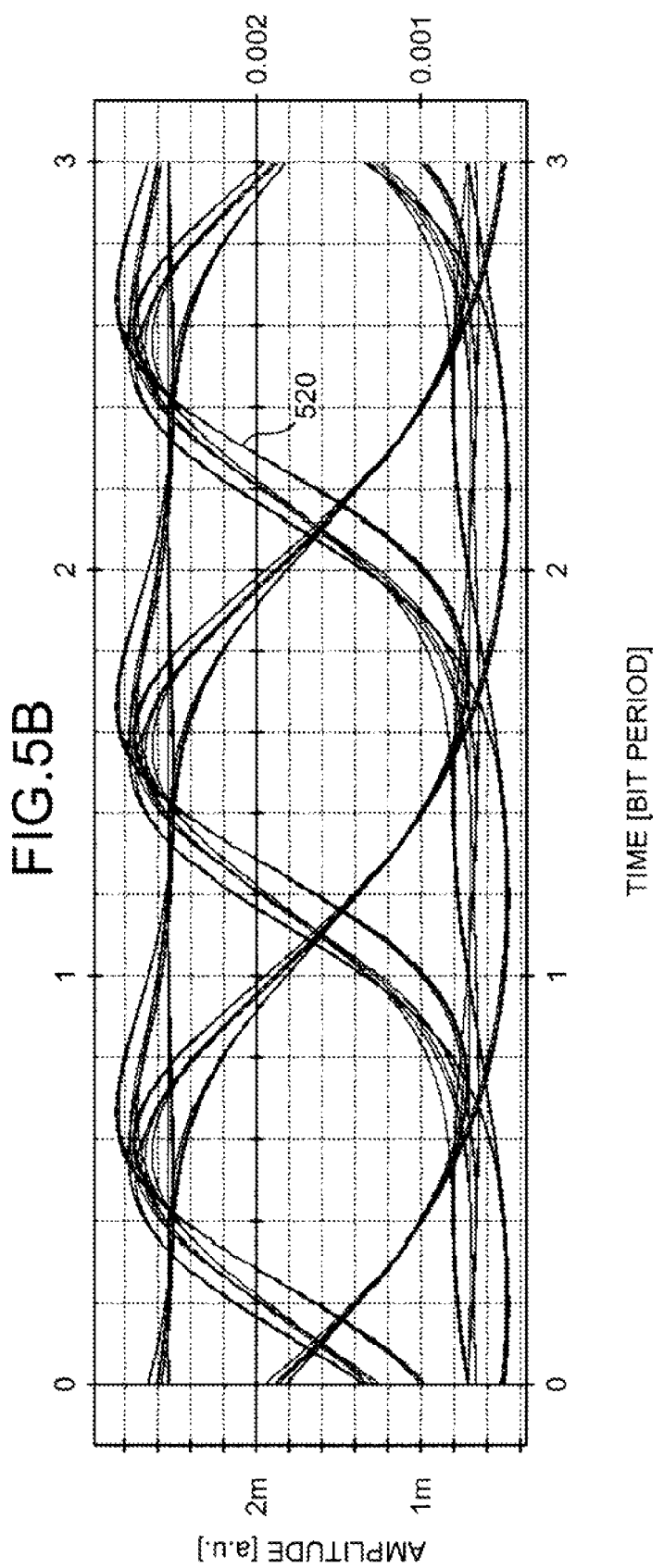

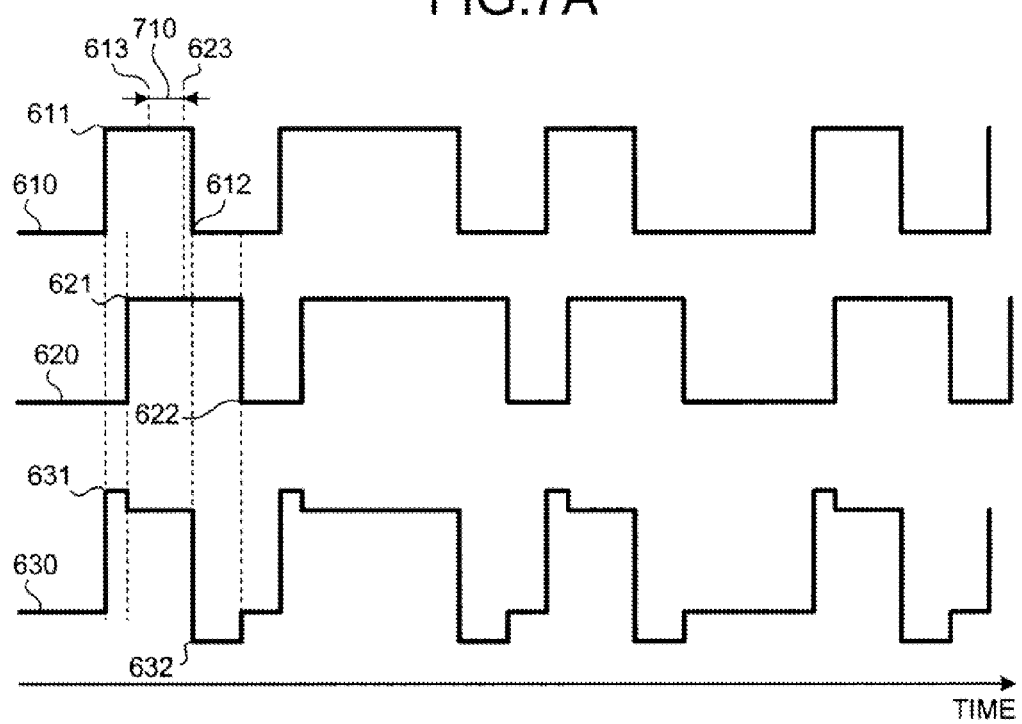

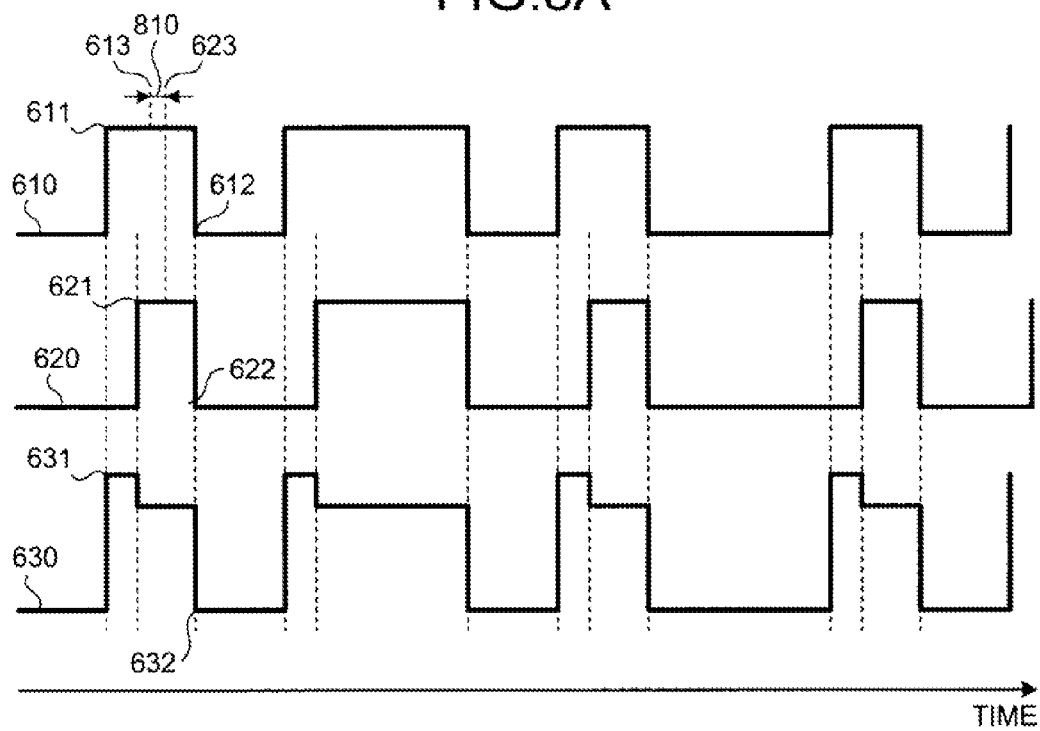

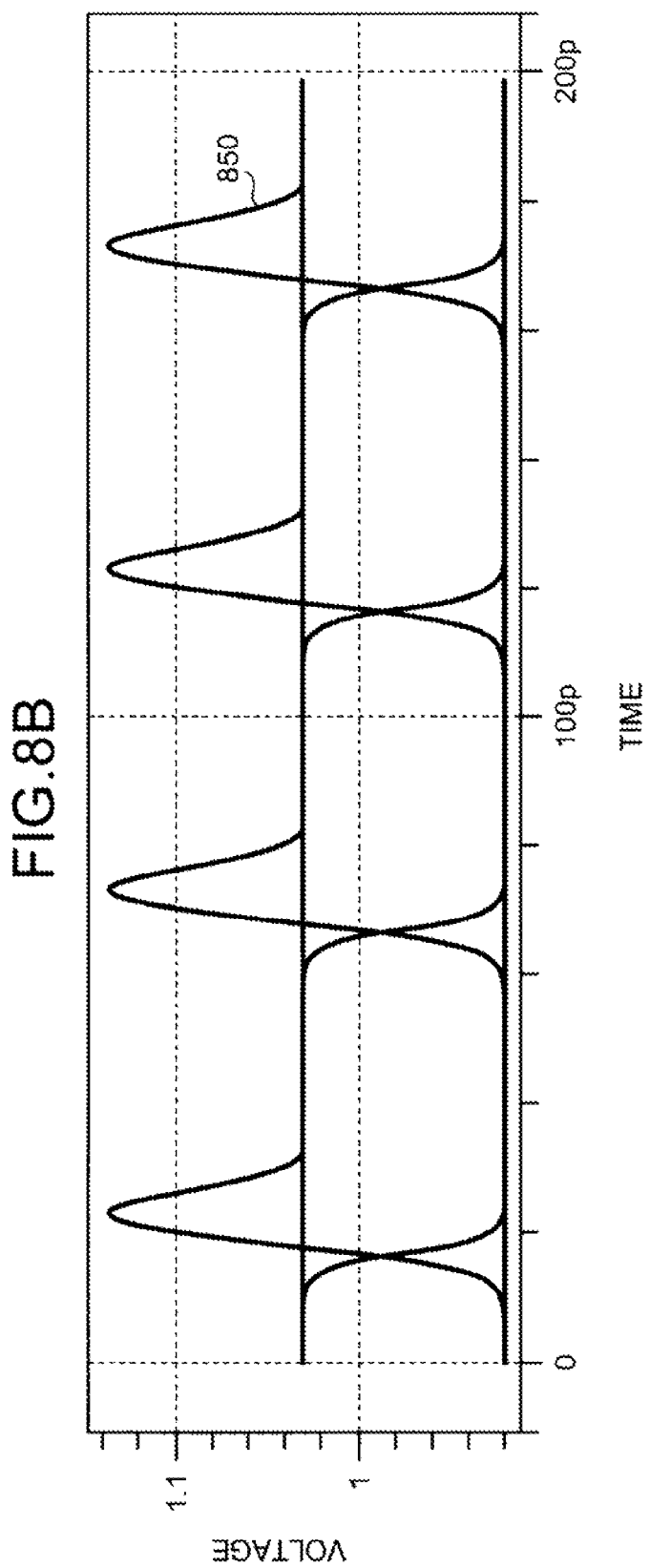

DRIVE CIRCUIT, OPTICAL TRANSMISSION APPARATUS, DRIVING METHOD, AND OPTICAL TRANSMISSION METHOD

CROSS REFERENCE TO RELATED APPLICATIONS

This application is based upon and claims the benefit of priority of the prior Japanese Patent Application No. 2010-183038, filed on Aug. 18, 2010, the entire contents of which are incorporated herein by reference.

FIELD

The embodiment discussed herein is related to a drive circuit, optical transmission apparatus, driving method, and optical transmission method.

BACKGROUND

Recently, accompanying the increased speed of data transmission, the application of optical signals, which have minimal deterioration even with high speed transmission over long distances, has replaced electrical signals that, conventionally, have been widely used as a data communications medium. When high optical signal quality is demanded such as with long distance optical transmission, an external modulator yielding high signal quality is often used as an optoelectronic converting device. However, schemes of using an external modulator have a problem of increased cost and consequently, for short distances, direct modulation is employed, where an optoelectronic device (light emitting device) such as a laser diode (LD) is directly turned ON and OFF to convert an electrical signal into an optical signal.

When an LD is used for direct modulation with an electrical signal, even if an electrical signal having symmetrical rising and falling edges is input, consequent to the properties of the LD, such as relaxation oscillation, the LD output is a waveform having asymmetrical rising and falling edges, arising in a problem of degraded transmission characteristics. Therefore, asymmetrical pre-emphasis is used, where, at the electrical signal stage, by preliminarily emphasizing the falling edge (falling edge peaking), which significantly degrades compared to the rising edge, the degradation is compensated (for example, refer to Japanese Laid-Open Patent Publication No. 2006-40974).

In the case of direct modulation using an LD and an electrical signal, from the perspective of optical signal quality improvement and high speed operation, asymmetrical pre-emphasis of not only emphasizing the falling edge of the signal, but also preliminarily emphasizing the rising edge of the signal (rising edge and falling edge peaking) is also employed. In this case as well, like the technique in Japanese Laid-Open Patent Publication No. 2006-40974, a technique is used where the emphasis of the falling edge becomes particularly great consequent to the rising edges and falling edges being asymmetrical.

Nonetheless, with the conventional techniques above, the circuit configuration implementing asymmetrical pre-emphasis is complicated, whereby the scale of the drive circuit becomes large and parasitic capacitance increases making high speed operation difficult. The increased scale of the drive circuit results in a further problem of increased power consumption.

SUMMARY

According to an aspect of an embodiment, a drive circuit includes a duty cycle adjusting circuit that changes the duty cycle of a first signal; and a calculator that subtracts one of the first signal for which the duty cycle has been adjusted and a second signal having a phase and amplitude that differ from that of the first signal from the other signal and adds the first signal to the second signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 depicts an example of a configuration of a drive circuit according to an embodiment.

FIG. 2 depicts an example of a configuration of an optical transmission apparatus according to the embodiment.

FIG. 3 is a graph of an example of electro-optical characteristics of a light emitting device.

FIG. 4A depicts an exemplary waveform of a drive signal input to the drive circuit.

FIG. 4B depicts an exemplary eye pattern of the drive signal input to the drive circuit.

FIG. 5A depicts an exemplary waveform of an optical signal output from the light emitting device when shaping of the drive signal is assumed to not be performed.

FIG. 5B depicts an exemplary eye pattern of the optical signal output from the light emitting device, when shaping of the drive signal is assumed to not be performed.

FIGS. 7A and 7B depict a second example of drive signal shaping.

FIGS. 8A and 8B depict a third example of drive signal shaping.

DESCRIPTION OF EMBODIMENTS

Figure 6A:
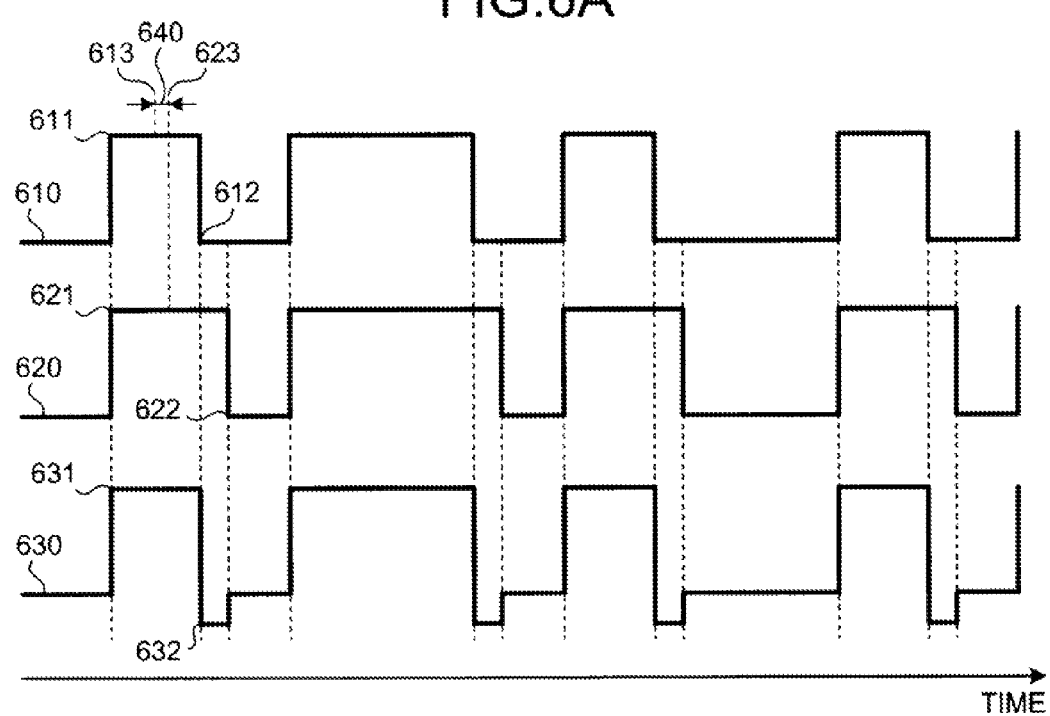
FIGS. 6A and 6B depict a first example of drive signal shaping.

Preferred embodiments of the present invention will be explained with reference to the accompanying drawings.

FIG. 1 depicts an example of a configuration of a drive circuit according to an embodiment. As depicted in FIG. 1, a drive circuit 100, for example, shapes the drive signal of a light emitting device (for example, refer to FIG. 2). The drive circuit 100 includes a splitter 110, an amplifier 120, a delay circuit 130, an amplifier 140, a duty adjusting circuit 150, a subtractor 160, and an amplifier 170.

The drive signal is input to the splitter 110. The drive signal may be for example, a single-end signal or a differential signal pair including a normal phase signal and a reverse phase signal. The splitter 110 splits the drive signal and outputs the resulting branches of the drive signal to the amplifier 120 and the delay circuit 130, respectively. The amplifier 120 adjusts the strength of the drive signal output from the splitter 110 and outputs the adjusted drive signal to the subtractor 160.

The delay circuit 130 is a delay adjusting unit that induces a delay difference on the branches of the drive signal obtained by the splitter 110. The delay difference of the drive signals, for example, is the difference between a central point of each of the drive signals, i.e., a central point between a rising edge and a falling edge. For example, the delay circuit 130 delays the drive signal output from the splitter 110 by a delay of $\tau 1$ (>0) and outputs the delayed drive signal to the amplifier 140. The amplifier 140 adjusts the strength of the drive signal output from the delay circuit 130 and outputs the adjusted drive signal to the duty adjusting circuit 150.

The duty adjusting circuit 150 is a duty cycle adjusting circuit that induces a duty cycle difference (duty offset) on the drive signals obtained by the splitter 110. For example, the duty adjusting circuit 150 adjusts the duty cycle of the drive signal output from the amplifier 140. Further, for example, the duty adjusting circuit 150 symmetrically changes the rising region of the drive signal (ON region) in a temporal direction with respect to the central point to adjust the duty cycle. The duty adjusting circuit 150 outputs the adjusted drive signal to the subtractor 160.

The subtractor 160 subtracts the drive signal output from the amplifier 120 from the drive signal output from the duty adjusting circuit 150. Further, the subtractor 160 may perform the subtraction after weighting the drive signals respectively output from the amplifier 120 and the duty adjusting circuit 150. The subtractor 160 outputs the resulting drive signal to the amplifier 170. The amplifier 170 adjusts the strength of the drive signal output from the subtractor 160 and outputs the adjusted drive signal.

Thus, the drive circuit 100 is able to shape and output a drive signal input thereto. The drive signal output from the drive circuit 100 is, for example, input to a light emitting device. Although the drive circuit 100 has been described to have a configuration in which the delay circuit 130, the amplifier 140, and the duty adjusting circuit 150 are sequentially connected, the configuration may incorporate these components connected in a different sequence.

The delay $\tau 1$ at the delay circuit 130 may be variable, or may be fixed. For example, the delay $\tau 1$ at the delay circuit 130 may be changed by an adjuster (for example, user) operation. In this case, the delay difference of the branched drive signals is changeable by an adjuster operation, whereby the delay $\tau 1$ can be adjusted according to device characteristics, such as those of a light emitting device driven by a drive signal.

The duty cycle adjusted by the duty adjusting circuit 150 may be variable, or may be fixed. For example, the duty cycle adjusted by the duty adjusting circuit 150 may be changeable by an adjuster operation. In this case, the difference of the duty cycles of the branched drive signals can be changed by an adjuster operation, whereby the duty cycle can be adjusted by the duty adjusting circuit 150, according to device characteristics such as those of a light emitting device driven by a drive signal.

FIG. 2 depicts an example of a configuration of an optical transmission apparatus according to the embodiment. As depicted in FIG. 2, an optical transmission apparatus 200 outputs an optical signal that is based on a drive signal input thereto. For example, the optical transmission apparatus 200 includes the drive circuit 100 depicted in FIG. 1 and a light emitting device 210. The drive circuit 100 shapes the input drive signal and outputs the shaped drive signal to the light emitting device 210.

The light emitting device 210, for example, is an LD such as a Vertical Cavity Surface Emitting Laser (VCSEL) or Semiconductor Optical Amplifier (SOA). The light emitting device 210 is connected to the drive circuit 100 at one terminal while the other terminal is grounded. The light emitting device 210 outputs an optical signal that is based on the drive signal output from the drive circuit 100. Consequently, the optical transmission apparatus 200 is able to output an optical signal that is based on the drive signal input.

FIG. 3 is a graph of an example of electro-optical characteristics of the light emitting device. In FIG. 3, the horizontal axis represents the voltage input to the light emitting device 210 and the vertical axis represents the output optical power [mW] of the light emitting device 210. Electro-optical characteristic 300 is a characteristic of output optical power with respect to input voltage of the light emitting device 210. A drive signal 310 represents the drive signal (electrical signal) input to the light emitting device 210. Optical signal 320 represents the optical signal output from the light emitting device 210. The optical transmission apparatus 200 depicted in FIG. 2, as depicted in FIG. 3, by an input of the drive signal 310 to the light emitting device 210, the light emitting device 210 performs direct modulation and output the optical signal 320.

FIG. 4A depicts an exemplary waveform of the drive signal input to the drive circuit. In FIG. 4A, the horizontal axis represent time and the vertical axis represent voltage. Waveform 410 represents the waveform of a drive signal input to the drive circuit 100. FIG. 4B depicts an exemplary eye pattern of the drive signal input to the drive circuit. In FIG. 4B, the horizontal axis represents time [bit period] and the vertical axis represents amplitude [a.u.]. An eye pattern 420 represents the eye pattern of the drive signal input to the drive circuit 100. As depicted in FIGS. 4A and 4B, a drive signal, of which the rising edge and the falling edge have not been corrected (e.g., strength adjustment), is input to the drive circuit 100, for example.

FIG. 5A depicts an exemplary waveform of the optical signal output from the light emitting device when the shaping of the drive signal is assumed to not be performed. In FIG. 5A, the horizontal axis represents time and the vertical axis represents voltage. Waveform 510 represents, for reference, the waveform of the optical signal output from the light emitting device 210, when the drive signal is assumed to be input to the light emitting device 210 without being shaped by the drive circuit 100 as depicted in FIGS. 4A and 4B.

FIG. 5B depicts an exemplary eye pattern of the optical signal output from the light emitting device, when the shaping of the drive signal is assumed to not be performed. In FIG. 5B, the horizontal axis represents time [bit period] and the vertical axis represent amplitude [a.u.]. An eye pattern 520 represents, for reference, the eye pattern of the optical signal output from the light emitting device 210, when the drive signal is assumed to be input to the light emitting device 210 without being shaped by the drive circuit 100 as depicted in FIGS. 4A and 4B.

As depicted in FIGS. 5A and 5B, if a drive signal having rising edges and falling edges that are symmetrical (refer to FIGS. 4A and 4B) is input to the light emitting device 210, the light emitting device 210 has a characteristic of outputting an optical signal having rising edges and falling edges that are asymmetrical. For example, consequent to factors such as relaxation oscillation, the optical signal output by the light emitting device 210 has falling edges that are more gradual than the rising edges. In this case, for example, the transmission characteristics of the optical signal degrade.

Figure 6B:
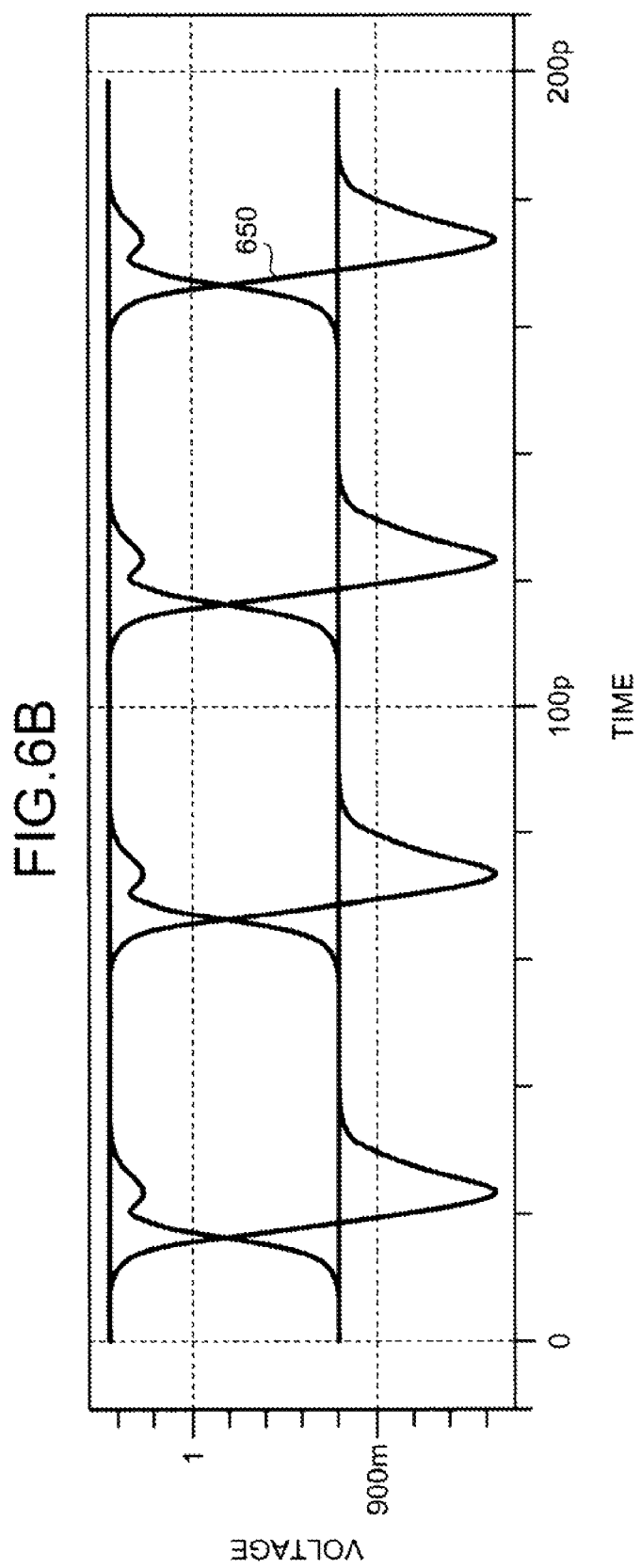

FIGS. 6A and 6B depict a first example of drive signal shaping. Drive signals 610, 620, and 630 depicted in FIG. 6A represent the waveforms of drive signals in the drive circuit 100. The drive signal 610 is a drive signal output from the amplifier 120 to the subtractor 160. A rising edge 611 is a rising edge of the drive signal 610. A falling edge 612 is a falling edge of the drive signal 610. A central point 613 is a central point between the rising edge 611 and the falling edge 612 of the drive signal 610.

The drive signal 620 is a drive signal output from the duty adjusting circuit 150 to the subtractor 160. A rising edge 621 is a rising edge of the drive signal 620. A falling edge 622 is a falling edge of the drive signal 620. A central point 623 is a central point between the rising edge 621 and the falling edge 622 of the drive signal 620.

The drive signal 630 is a drive signal output from the amplifier 170. A rising edge 631 is a rising edge of the drive signal 630. A falling edge 632 is a falling edge of the drive signal 630. Although, here, the head rising edge, the head falling edge and the head central point of the drive signals 610, 620, and 630 depicted in FIG. 6A have been described, the same description is applicable for other rising edges, falling edges, and central points of the drive signals 610, 620, and 630.

In the example depicted in FIG. 6A, the duty adjusting circuit 150 adjusts the duty cycle of drive signal 620 to be greater than that of the drive signal 610. Further, the delay circuit 130 delays the drive signal 620 so that a delay difference 640 between the central point 613 of the drive signal 610 and the central point 623 of the drive signal 620 is obtained. Consequently, the delay circuit 130 makes the timings of the rising edge 611 of the drive signal 610 and the rising edge 621 of the drive signal 620 coincide.

Thus, the delay circuit 130, by adjusting the delay difference 640 to make the timings of the rising edges of the drive signals coincide, causes the drive signal 630 to become a drive signal in which the falling edge 632 is emphasized. An eye pattern 650 depicted in FIG. 6B is an eye pattern of the drive signal 630 depicted in FIG. 6A. By an input of the drive signal 630, whose falling edge has been emphasized in this manner, to the light emitting device 210, the light emitting device 210 in which the falling edge of the optical signal becomes more gradual than the rising edge, is able to output an optical signal having a falling edge and a rising edge that are equivalent.

Figure 7B:
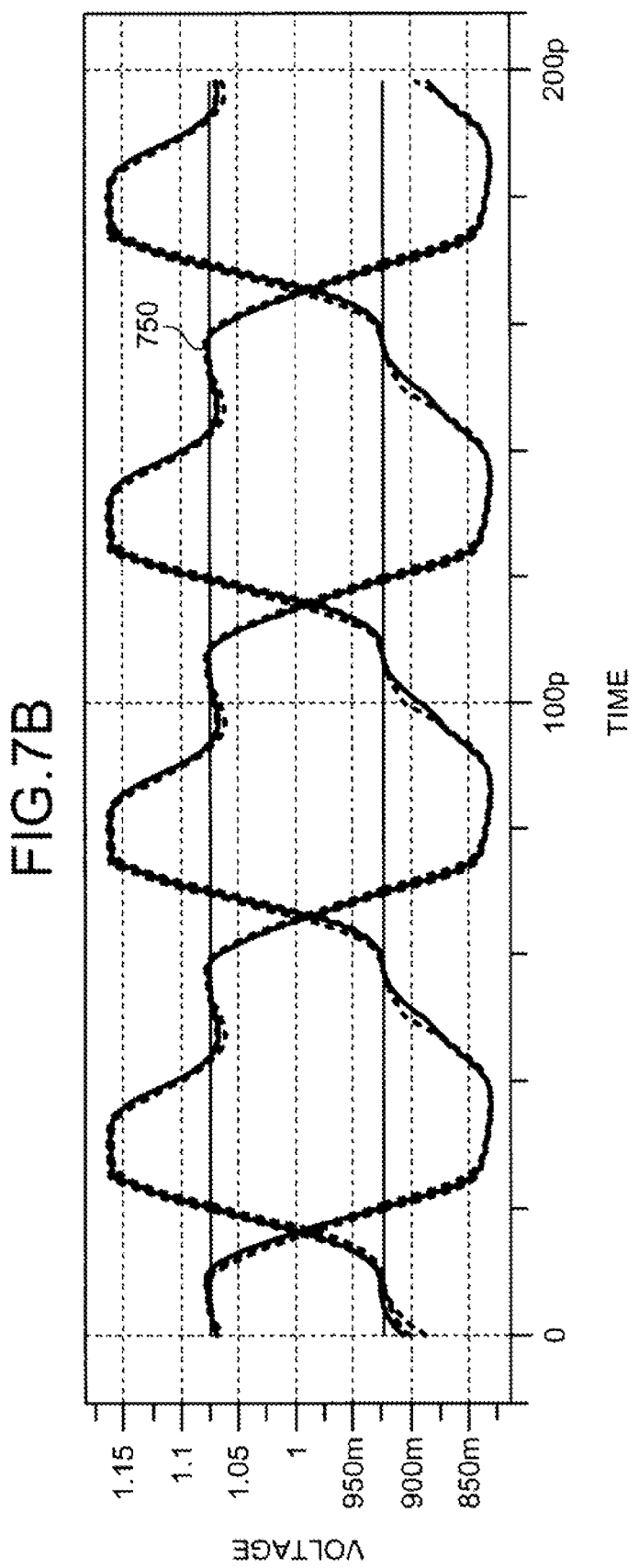

FIGS. 7A and 7B depict a second example of drive signal shaping. In FIG. 7A, parts identical to those depicted in FIG. 6A are given the same reference numerals used in FIG. 6A and description therefor is omitted. In the example depicted in FIG. 7A, the duty adjusting circuit 150 adjusts the duty cycle of the drive signal 620 to be more than that of the drive signal 610.

Further, the delay circuit 130 delays the drive signal 620 so that a delay difference 710 between the central point 613 of the drive signal 610 and the central point 623 of the drive signal 620 is obtained. Consequently, the delay circuit 130 staggers the timings of the rising edge 611 and the rising edge 621 and staggers the timings of the falling edge 612 and the falling edge 622.

Thus, the delay circuit 130 adjusts the delay difference 710 to stagger the timings of the rising edges of the drive signals and to stagger the timings of the falling edges of the drive signals. Consequently, the drive signal 630 becomes a drive signal in which the rising edge 631 and the falling edge 632 are emphasized and, the correction amount of the rising edge 631 and of the falling edge 632 (here, emphasis amount) asymmetrical. Here, the emphasis amount of the falling edge 632 of the drive signal 630 is greater than that of the rising edge 631. An eye pattern 750 depicted in FIG. 7B is the eye pattern of the drive signal 630 depicted in FIG. 7A.

Thus, by an input of the drive signal 630, in which the rising edge 631 and the falling edge 632 have been emphasized, to the light emitting device 210, a high quality optical signal can be generated at a high speed by the light emitting device 210, even if there are limitations on the high speed responsiveness of the light emitting device 210. Further, by an input of the drive signal 630, in which the emphasis amount of the falling edge 632 is greater than that of the rising edge 631, to the light emitting device 210, the light emitting device 210 in which the falling edge of the optical signal becomes more gradual than the rising edge, is able to output an optical signal having a falling edge and a rising edge that are equivalent.

FIGS. 8A and 8B depict a third example of drive signal shaping. In FIG. 8A, parts identical to those depicted in FIG. 6A are given the same reference numerals used in FIG. 6A and description thereof is omitted. In the example, depicted in FIG. 8A, the duty adjusting circuit 150 adjusts the duty cycle of the drive signal 620 to be lower than that of the drive signal 610. Further, the delay circuit 130 delays the drive signal 620 so that a delay difference 810 between the central point 613 of the drive signal 610 and the central point 623 of the drive signal 620 is obtained. Consequently, the delay circuit 130 makes the timings of the falling edge 612 of the drive signal 610 and the falling edge 622 of the drive signal 620 coincide.

Thus, by adjusting the delay difference 810 to make the timings of the falling edges of the drive signals coincide, the delay circuit 130 causes the drive signal 630 to become a drive signal in which the rising edge 631 is emphasized. An eye pattern 850 depicted in FIG. 8B is the eye pattern of the drive signal 630 depicted in FIG. 8A.

Figure 9:
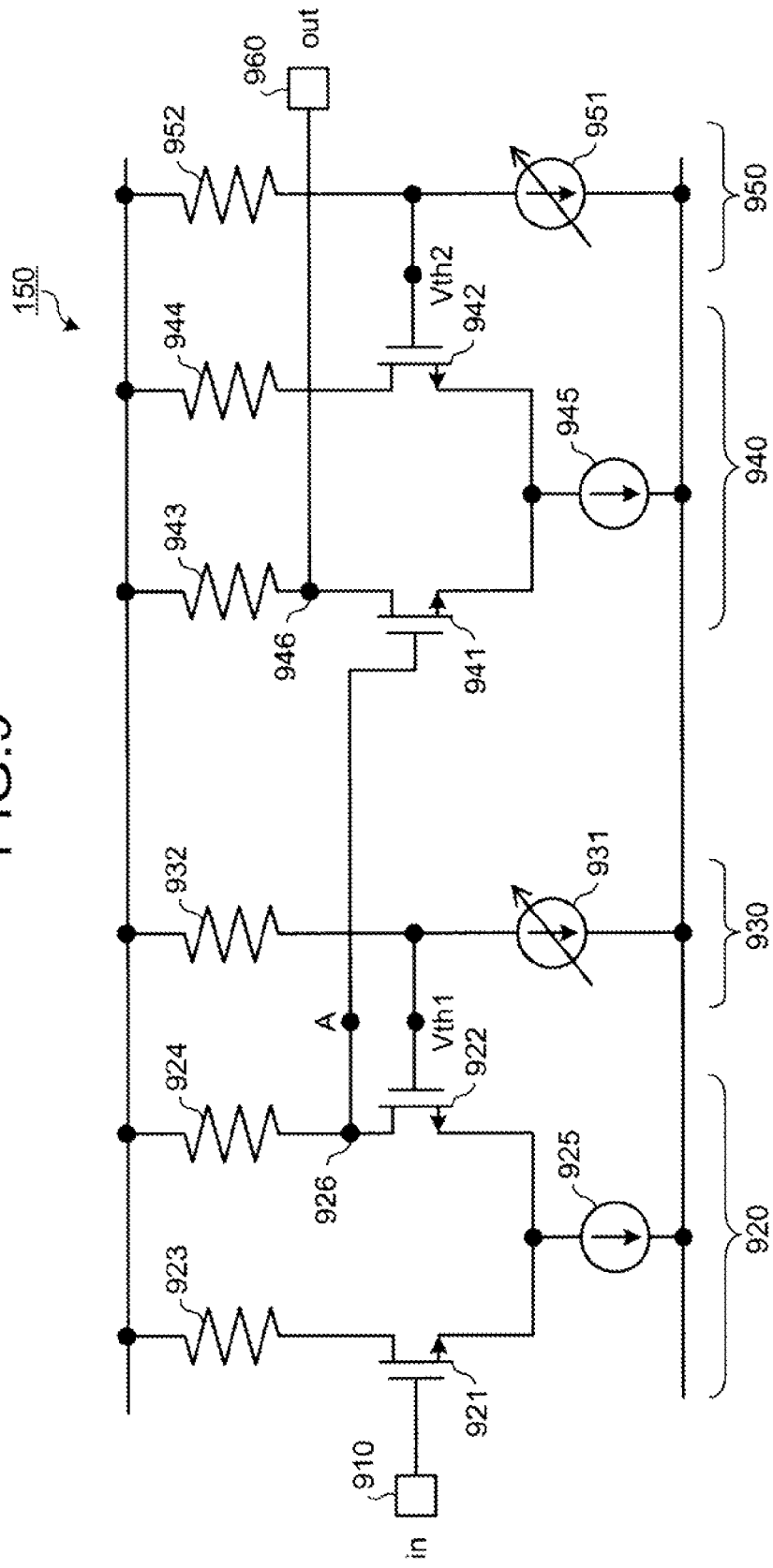
FIG. 9 depicts a first exemplary configuration of a duty adjusting circuit.

FIG. 9 depicts a first exemplary configuration of the duty adjusting circuit. The duty adjusting circuit 150 depicted in FIG. 9, for example, is applicable if the drive signal is a single-end signal. The duty adjusting circuit 150 depicted in FIG. 9 includes input terminal 910, differential circuits 920 and 940, threshold adjusting circuits 930 and 950, and an output terminal 960.

The input terminal 910 receives input of the drive signal output from the amplifier 140 (in). The differential circuit 920 is a Long-Tailed Pair (LTP)-type differential amplifier circuit. For example, the differential circuit 920 includes transistors 921 and 922, resistors 923 and 924, and a power source 925. The transistors 921 and 922 are respectively, for example, field effect transistors (FET), bipolar junction transistors (BJT) and the like. In this example, the transistors 921 and 922 are respectively described as FETs.

The gate of the transistor 921 is connected to the input terminal 910. The drain of the transistor 921 is connected to the resistor 923. The source of the transistor 921 is connected to the power source 925. The gate of the transistor 922 is connected to the threshold adjusting circuit 930. The drain of the transistor 922 is connected to the resistor 924. The source of the transistor 922 is connected to the power source 925.

One terminal of the resistor 923 is connected to the drain of the transistor 921 and the other terminal thereof is connected to a power source (not depicted). One terminal of the resistor 924 is connected to the drain of the transistor 922 and the other terminal thereof is connected to a power source (not depicted). A portion between the transistor 922 and the resistor 924 is an output unit 926 from which the drive signal from the differential circuit 920 is output. The power source 925 is connected at one terminal to the transistor 921 and the transistor 922, and the other terminal thereof is grounded.

The threshold adjusting circuit 930 is a circuit that adjusts the threshold level of the output of the differential circuit 920. For example, the threshold adjusting circuit 930 includes a variable power source 931 and a resistor 932. The variable power source 931 is connected at one terminal to the gate of the transistor 922 and to the resistor 932, and the other terminal thereof is grounded. One terminal of the resistor 932 is connected to the variable power source 931 and the other terminal thereof is connected to a power source (not depicted).

The voltage applied to the gate of the transistor 922 is threshold Vth1 switching the drive signal output from the output unit 926 OFF and ON. By changing the value of the current of the variable power source 931, the threshold Vth1 varies, whereby the timing of a cross point (point where the difference becomes zero), i.e., the switching point between ON and OFF of the drive signal output from the output unit 926, is shifted. Consequently, the duty cycle of the drive signal output from the output unit 926 can be varied.

The differential circuit 940 is of the same configuration as the differential circuit 920. For example, the differential circuit 940 includes transistors 941 and 942, resistors 943 and 944, and a power source 945. The transistors 941 and 942, the resistors 943 and 944, and the power source 945 of the differential circuit 940 are respectively identical to the transistors 921 and 922, the resistors 923 and 924, and the power source 925 of the differential circuit 920.

However, the gate of the transistor 941 is connected to the output unit 926 of the differential circuit 920. A point between the transistor 941 and the output unit 926 is regarded as point A. Further, a portion between the transistor 941 and the resistor 943 is an output unit 946 from which the drive signal from the differential circuit 940 is output.

The threshold adjusting circuit 950 is a circuit that adjusts the threshold of the output of the differential circuit 940. For example, the threshold adjusting circuit 950 includes a variable power source 951 and a resistor 952. The variable power source 951 is connected at one terminal to the gate of the transistor 942 and to the resistor 952, and the other terminal thereof is grounded. One terminal of the resistor 952 is connected to the variable power source 951 and other terminal thereof is connected to a power source (not depicted).

The voltage applied to the gate of the transistor 942 is threshold Vth2 switching the drive signal output from the output unit 946 OFF and ON. By changing the value of the current of variable power source 951, the threshold Vth2 varies, whereby the timing of a cross point, i.e., the switching point between ON and OFF of the drive signal output from the output unit 946, is shifted. Consequently, the duty cycle of the drive signal output from the output unit 946 can be varied.

The output terminal 960 is connected to the output unit 946 of the differential circuit 940. The output terminal 960 outputs the drive signal to a device downstream from the duty adjusting circuit 150 (out). In the duty adjusting circuit 150 depicted in FIG. 9, the differential circuit 940 and the threshold adjusting circuit 950 may be omitted from the configuration, in which case, the output terminal 960, for example, is connected to the output unit 926 of the differential circuit 920.

Figure 10:
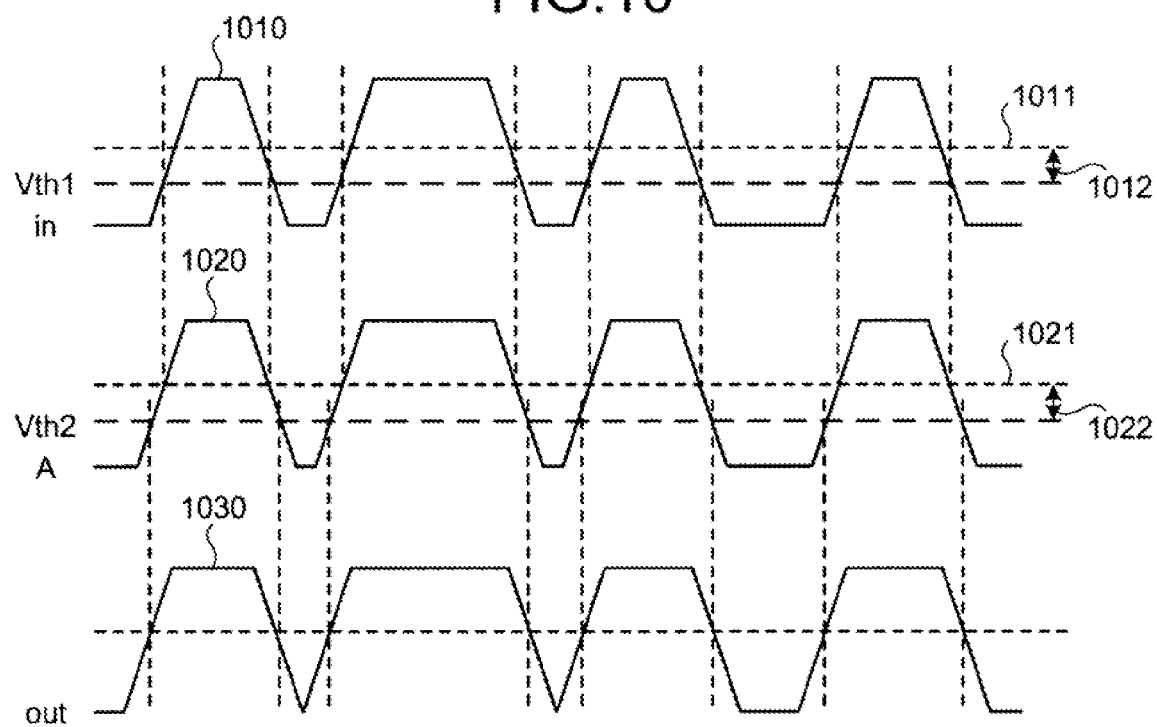
FIG. 10 depicts an example of duty cycle adjustment by the duty adjusting circuit having the first exemplary configuration.

FIG. 10 depicts an example of duty cycle adjustment by the duty adjusting circuit having the first exemplary configuration. As depicted in FIG. 10, a drive signal 1010 depicts, as a waveform, a drive signal (in) input to the input terminal 910 depicted in FIG. 9. A drive signal 1020 depicts, as a waveform, a drive signal of point A depicted in FIG. 9. A drive signal 1030 depicts, as a waveform, the drive signal (out) output from the output terminal 960 depicted in FIG. 9.

Electric potential 1011 is a central value of the electric potential of the drive signal 1010. By changing the value of the current of the variable power source 931, the threshold Vth1 becomes less than the electric potential 1011, whereby a direct current offset (DC offset) 1012 is obtained between the threshold Vth1 and the electric potential 1011. As a result, the drive signal 1020 output from the output unit 926 of the differential circuit 920 has a duty cycle that is higher than that of the drive signal 1010.

Electric potential 1021 is a central value of the electric potential of the drive signal 1020. By changing the value of the current of the variable power source 951, the threshold Vth2 becomes less than the electric potential 1021, whereby a DC offset 1022 between the threshold Vth2 and the electric potential 1021 is obtained. As a result, the drive signal 1030 output from the output unit 946 of the differential circuit 940 has a duty cycle that is higher than that of the drive signal 1020.

Although not depicted, by changing the value of the current of the variable power source 931, the threshold Vth1 may be made greater than the electric potential 1011. In this case, the drive signal 1020 output from the output unit 926 of the differential circuit 920 has a duty cycle that is greater than that of the drive signal 1010. Similarly, by changing the value of the current of the variable power source 951, the threshold Vth2 may be made greater than the electric potential 1021. In this case, the drive signal 1030 output from the output unit 946 of the differential circuit 940 has a duty cycle that is lower than that of the drive signal 1020.

In this manner, a drive signal having a duty cycle that has been adjusted according to the values of the currents of the variable power source 931 and of the variable power source 951 is output from the output terminal 960. Further, in the duty adjusting circuit 150 depicted in FIG. 9, the rising region (ON region) of the drive signal 1020, with respect to the drive signal 1010, changes symmetrically about a central point, in a temporal direction.

Figure 11:
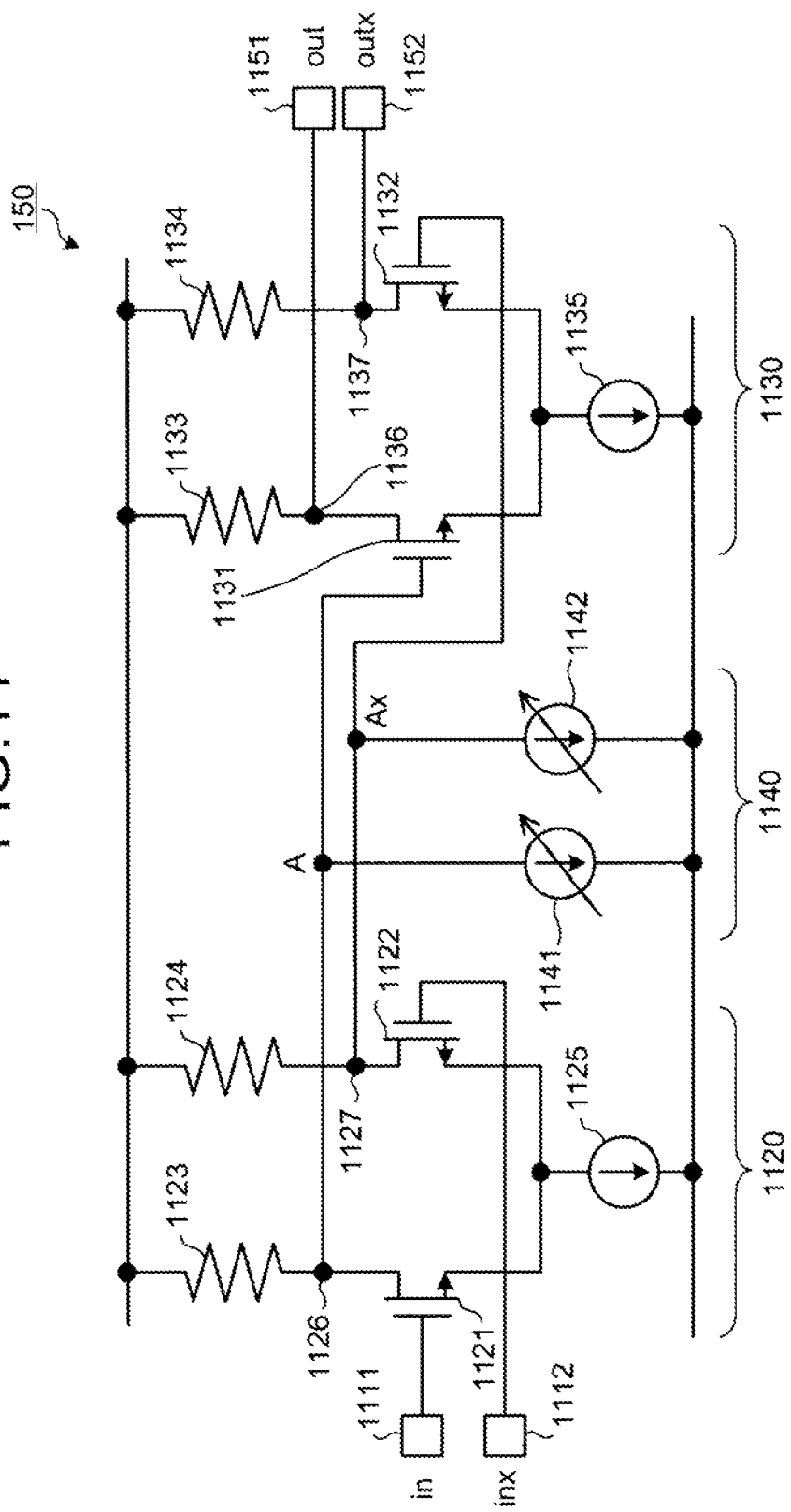
FIG. 11 depicts a second exemplary configuration of the duty adjusting circuit.

FIG. 11 depicts a second exemplary configuration of the duty adjusting circuit. The duty adjusting circuit 150 depicted in FIG. 11 is, for example, applicable if the drive signal is a differential signal pair. The duty adjusting circuit 150 depicted in FIG. 11 includes input terminals 1111 and 1112, differential circuits 1120 and 1130, an offset adjusting circuit 1140, and output terminals 1151 and 1152.

The input terminal 1111 receives input of the normal phase signal of the drive signal output from the amplifier 140 (in). The input terminal 1112 receives input of the reverse phase signal of the drive signal output from the amplifier 140 (inx). The differential circuit 1120 is an LTP-type differential amplifier circuit. For example, the differential circuit 1120 includes transistors 1121 and 1122, resistors 1123 and 1124, and a power source 1125. The transistors 1121 and 1122 respectively, for example, are FETs, BJTs, etc. In this example, the transistors 1121 and 1122 are respectively described as FETs.

The gate of the transistor 1121 is connected to the input terminal 1111. The drain of the transistor 1121 is connected to the resistor 1123. The source of the transistor 1121 is connected to the power source 1125. The gate of the transistor 1122 is connected to the input terminal 1112. The drain of the transistor 1122 is connected to the resistor 1124. The source of the transistor 1122 is connected to the power source 1125.

One terminal of the resistor 1123 is connected to the drain of the transistor 1121 and the other terminal thereof is connected to a power source (not depicted). A portion between the transistor 1121 and the resistor 1123 is an output unit 1126 from which the normal phase signal is output from the differential circuit 1120. One terminal of the resistor 1124 is connected to the drain of the transistor 1122 and the other terminal thereof is connected to a power source (not depicted). A portion between the transistor 1122 and the resistor 1124 is an output unit 1127 from which the reverse phase signal is output from the differential circuit 1120. The power source 1125, at one terminal is connected to the transistor 1121 and the transistor 1122, and the other terminal thereof is grounded.

The differential circuit 1130 is of a configuration that is identical to that of the differential circuit 1120. For example, the differential circuit 1130 includes transistors 1131 and 1132, resistors 1133 and 1134, and a power source 1135. The transistors 1131 and 1132, the resistors 1133 and 1134, and the power source 1135 of the differential circuit 1130 are respectively identical to the transistors 1121 and 1122, the resistors 1123 and 1124, and the power source 1125 of the differential circuit 1120.

However, the gate of the transistor 1131 is connected to the output unit 1126 (for the normal phase signal) of the differential circuit 1120. A point between the transistor 1131 and the output unit 1126 is regarded as point A. Further, a portion between the transistor 1131 and the resistor 1133 is an output unit 1136 from which the normal phase signal of the differential circuit 1130 is output.

Further, the gate of the transistor 1132 is connected to the output unit 1127 (for the reverse phase signal) of the differential circuit 1120. A point between the transistor 1132 and the output unit 1127 is regarded as point Ax. Furthermore, a portion between the transistor 1132 and the resistor 1134 is an output unit 1137 from which the reverse phase signal is output from the differential circuit 1130.

The offset adjusting circuit 1140 is a circuit that adjusts the DC offset between the differential circuit 1120 and the differential circuit 1130. For example, the offset adjusting circuit 1140 includes variable power sources 1141 and 1142. The variable power source 1141, at one terminal is connected to point A, and the other terminal thereof is grounded. The variable power source 1142, at one terminal is connected to point Ax, and the other terminal thereof is grounded. By changing the values of the currents of the variable power source 1141 and of the variable power source 1142, the DC offset of the differential circuit 1120 and the differential circuit 1130 can be adjusted.

The output terminal 1151 is connected to the output unit 1136 (for the normal phase signal) of the differential circuit 1130. The output terminal 1151 outputs the normal phase signal to a device downstream from the duty adjusting circuit 150 (out). The output terminal 1152 is connected to the output unit 1137 (for the reverse phase signal) of the differential circuit 1130. The output terminal 1152 outputs the reverse phase signal to a device downstream from the duty adjusting circuit 150 (outx). As a result, a differential signal pair that includes the normal phase signal and the reverse phase signal can be output.

In this manner, the duty adjusting circuit 150 depicted in FIG. 11, with respect to a drive signal that is a differential signal pair, obtains a DC offset by the differential circuit 1120 and the offset adjusting circuit 1140. The duty adjusting circuit 150 uses the differential circuit 1130 to perform differential amplification on the drive signal having the DC offset, whereby the duty cycle of the drive signal can be varied.

Figure 12:
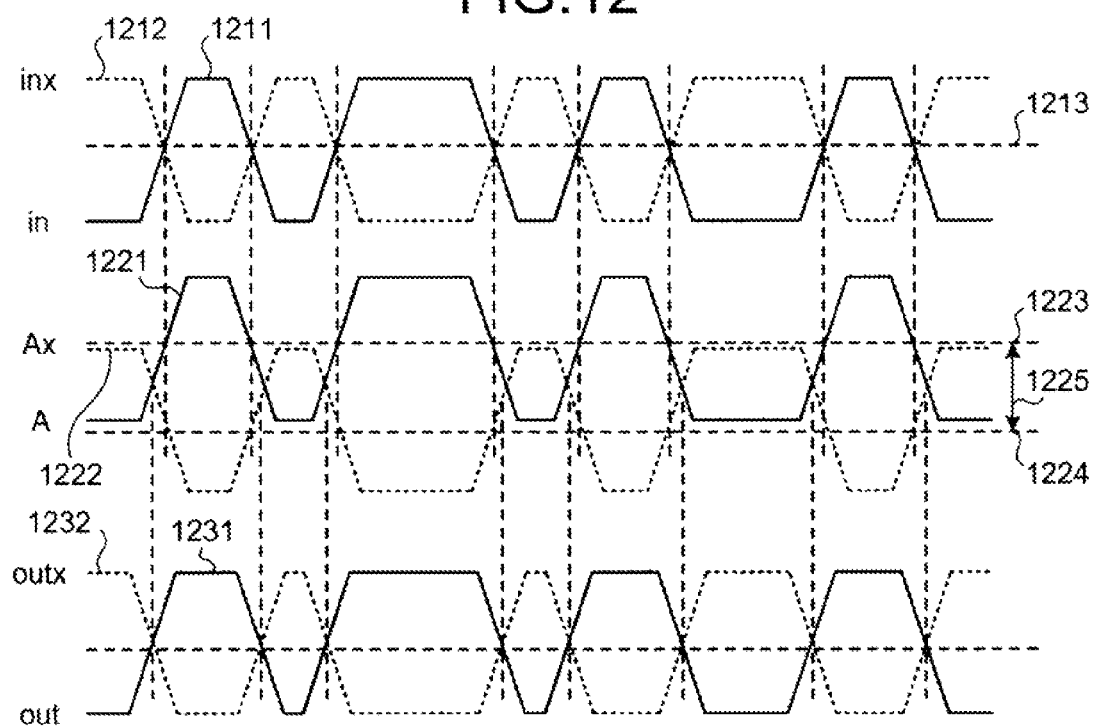
FIG. 12 is an example of duty cycle adjustment by the duty adjusting circuit having the second exemplary configuration.

FIG. 12 is an example of duty cycle adjustment by the duty adjusting circuit having the second exemplary configuration. A normal phase signal 1211 depicted in FIG. 12 depicts, as a waveform, a normal phase signal (in) input to the input terminal 1111 depicted in FIG. 11. A reverse phase signal 1212 depicts, as a waveform, a reverse phase signal (inx) input to the input terminal 1112 depicted in FIG. 11. The DC levels of the normal phase signal 1211 and the reverse phase signal 1212 are both DC level 1213.

A normal phase signal 1221 depicts, as a waveform, the normal phase signal of point A depicted in FIG. 11. A reverse phase signal 1222 depicts, as a waveform, the reverse phase signal of point Ax depicted in FIG. 11. A normal phase signal 1231 depicts, as a waveform, the normal phase signal (out) output from the output terminal 1151 depicted in FIG. 11. A reverse phase signal 1232 depicts, as a waveform, the reverse phase signal (out) output from the output terminal 1152 depicted in FIG. 11.

By changing the values of the currents of the variable power source 1141 and of the variable power source 1142, the DC level 1223 of the normal phase signal 1221 and the DC level 1224 of the reverse phase signal 1222 vary. Consequently, the DC offset 1225 between the normal phase signal 1221 and the reverse phase signal 1222 can be obtained. Therefore, the normal phase signal 1231 and the reverse phase signal 1232 respectively have a duty cycle that higher than that of the normal phase signal 1211 and the reverse phase signal 1212.

Here, an example was described in which by making the DC level 1223 of the normal phase signal 1221 higher than the DC level 1224 of the reverse phase signal 1222, the duty cycles of the normal phase signal 1231 and the reverse phase signal 1232 are made higher. On the contrary, configuration may be such that by making the DC level 1223 of normal phase signal 1221 lower than the DC level 1224 of the reverse phase signal 1222, the duty cycles of the normal phase signal 1231 and the reverse phase signal 1232 are made lower.

In this manner, the normal phase signal 1231 and the reverse phase signal 1232, the duty cycles of which have been adjusted according to the values of the currents of the variable power source 1141 and the variable power source 1142, are output from the output terminals 1151 and 1152. Further, in the duty adjusting circuit 150 depicted in FIG. 11, the rising regions (ON regions) of the normal phase signal 1231 and of the reverse phase signal 1232, respectively, are changed symmetrically about a central point, in a temporal direction, with respect to the normal phase signal 1211 and the reverse phase signal 1212.

Figure 13:
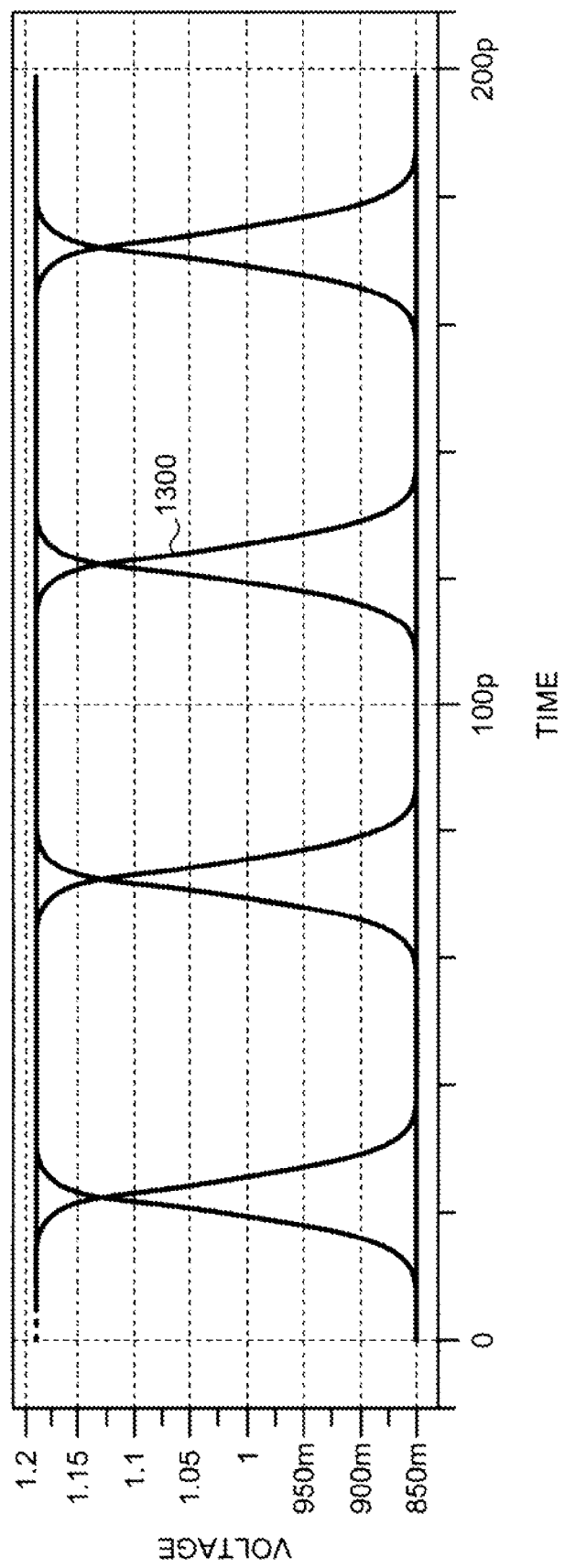
FIG. 13 depicts an exemplary eye pattern of a drive signal whose duty cycle has been adjusted by the duty adjusting circuit.

FIG. 13 depicts an exemplary eye pattern of the drive signal whose duty cycle has been adjusted by the duty adjusting circuit. The eye pattern 1300 depicted in FIG. 13 represents the output drive signal whose duty cycle has been adjusted by the duty adjusting circuit 150. As depicted by the eye pattern 1300, the duty cycle of the drive signal can be varied by the duty adjusting circuit 150 as compared to the eye pattern 420 depicted in FIG. 4B. The configuration of the duty adjusting circuit 150 is not limited to the configuration depicted in FIG. 9 or FIG. 11 and may be any configuration enabling adjustment of the duty cycle of the drive signal.

Figure 14:
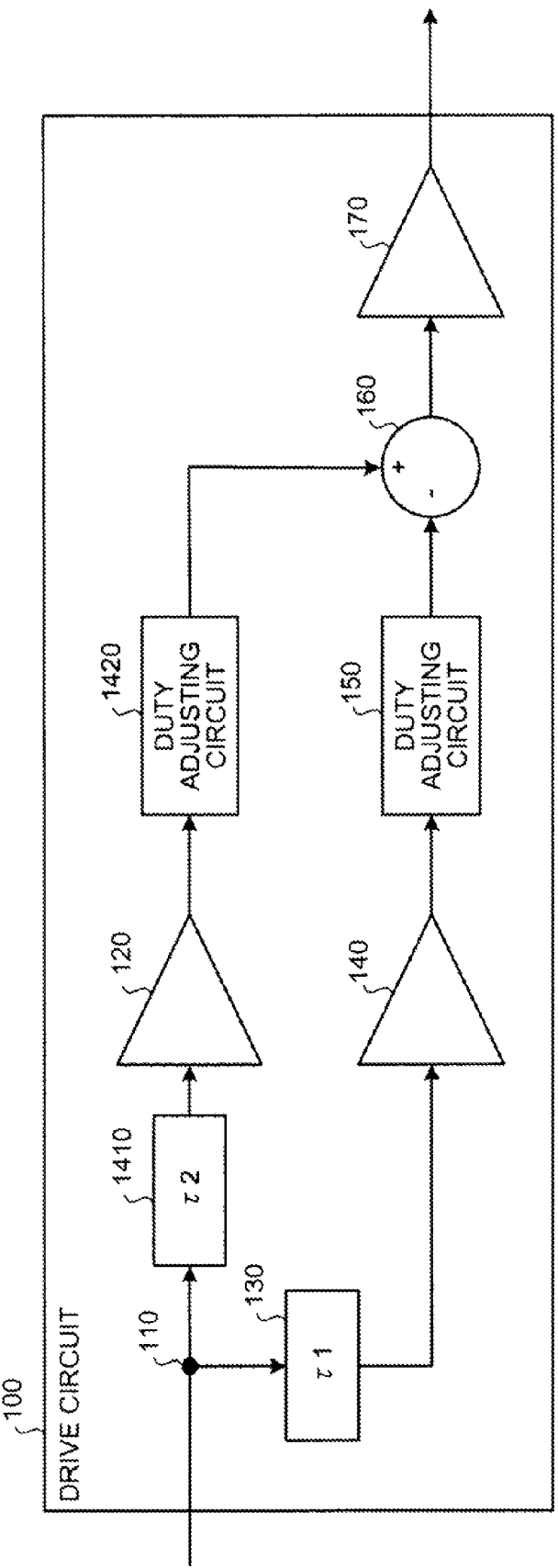
FIG. 14 is a first example of modification of the drive circuit.

FIG. 14 is a first example of modification of the drive circuit. In FIG. 14, components identical to those depicted in FIG. 1 are given the same reference numerals used in FIG. 1 and description thereof is omitted. As depicted in FIG. 14, the drive circuit 100 may include a delay circuit 1410 in addition to the configuration depicted in FIG. 1. The delay circuit 1410 delays the drive signal output from the splitter 110 to the amplifier 120 by a delay of τ2 (where, ≠τ1 and >0). In this case, the delay circuit 130 and the delay circuit 1410 form the delay adjusting unit that induces a delay difference on the branches of the drive signal obtained by the splitter 110.

Further, as depicted in FIG. 14, the drive circuit 100 may further include a duty adjusting circuit 1420 in addition to the configuration depicted in FIG. 1. The duty adjusting circuit 1420 adjusts the duty cycle of the drive signal output from the amplifier 120 and outputs the adjusted drive signal to the subtractor 160. In this case, the duty adjusting circuit 150 and the duty adjusting circuit 1420 form a duty adjusting unit that induces duty cycle difference on the branches of the drive signal obtained by the splitter 110. The duty adjusting circuit 1420, for example, may have the same configuration as the duty adjusting circuit 150 depicted in FIG. 9 or 11.

Further, the delay circuit 130 may be omitted from the configuration of the drive circuit 100 depicted in FIG. 14. In this case, the delay circuit 1410 forms the delay adjusting unit that induces the delay difference on the branches of the drive signal obtained by the splitter 110. Moreover, the duty adjusting circuit 150 may be omitted from the configuration of the drive circuit 100 depicted in FIG. 14. In this case, the duty adjusting circuit 1420 forms the duty adjusting unit that induces the duty cycle difference on the branches of the drive signal obtained by the splitter 110.

Figure 15:
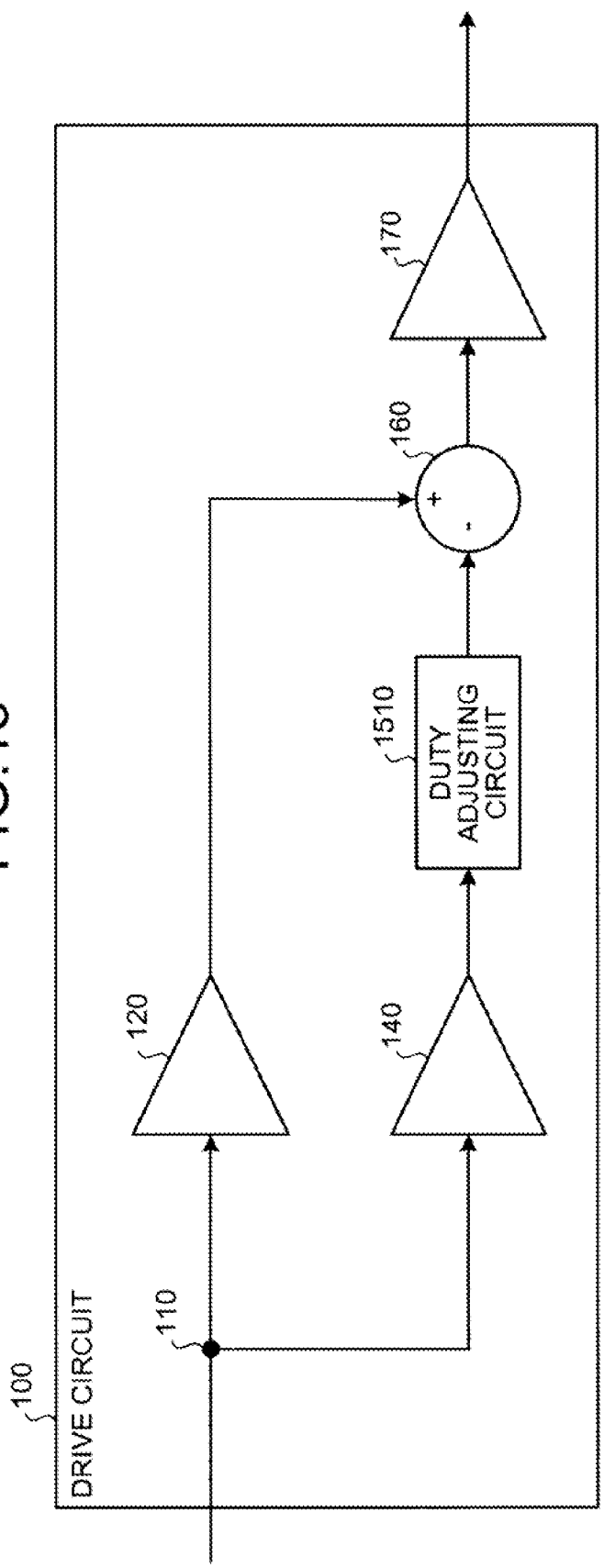
FIG. 15 depicts a second example of modification of the drive circuit.

FIG. 15 depicts a second example of modification of the drive circuit. In FIG. 15, components identical to those depicted in FIG. 1 are given the same reference numerals used in FIG. 1 and description thereof is omitted. As depicted in FIG. 15, the drive circuit 100 may include a duty adjusting circuit 1510 in place of the delay circuit 130 and the duty adjusting circuit 150 depicted in FIG. 1.

The duty adjusting circuit 1510 adjusts the duty cycle by asymmetrically changing with respect to a central point and in a temporal direction, the rising region (ON region) of the drive signal output from the amplifier 140. As a result, the drive signal whose duty cycle has been adjusted by the duty adjusting circuit 1510 has a central point that is between a rising edge and a falling edge and has shifted, whereby the delay adjusting unit, which induces delay difference on the branches of the drive signal obtained by the splitter 110, is implemented by the duty adjusting circuit 1510. Therefore, a configuration omitting the delay circuit 130 depicted in FIG. 1 can also implement asymmetrical pre-emphasis.

For example, the duty adjusting circuit 1510 expands the rising region of the drive signal rearward, whereby a drive signal like the drive signal 620 depicted in FIG. 6A can be obtained. Further, the duty adjusting circuit 1510 reduces the rising region of the drive signal in a forward direction and expands the rising region of the drive signal rearward, whereby a drive signal like the drive signal 620 depicted in FIG. 7A can be obtained. Moreover, the duty adjusting circuit 1510 reduces the rising region of the drive signal in a forward direction, whereby a drive signal like the drive signal 620 depicted in FIG. 8A can be obtained.

Figure 16:
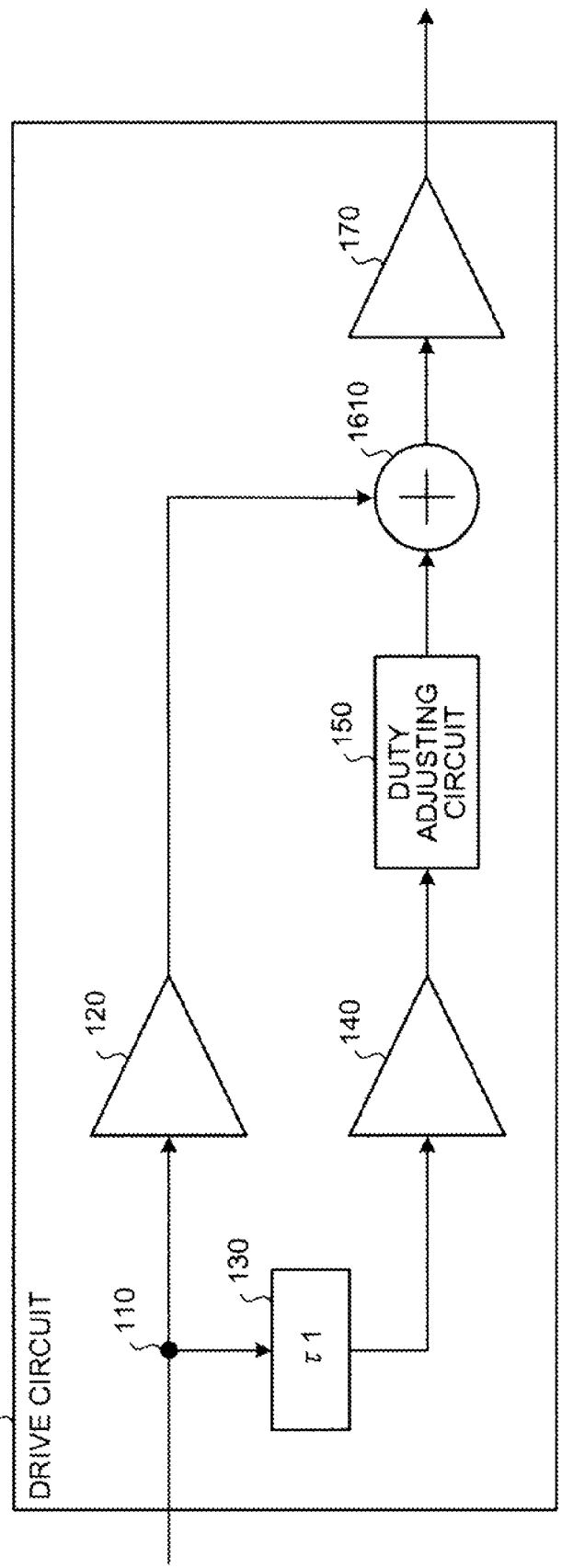
FIG. 16 depicts a third example of modification of the drive circuit.

FIG. 16 depicts a third example of modification of the drive circuit. In FIG. 16, components identical to those depicted in FIG. 1 are given the same reference numerals used in FIG. 1 and description thereof is omitted. As depicted in FIG. 16, the drive circuit 100 may include an adder 1610 in place of the subtractor 160 depicted in FIG. 1. The adder 1610 adds the drive signal output from the amplifier 120 to the drive signal output from the duty adjusting circuit 150 and outputs the resulting drive signal to the amplifier 170.

In this case, the drive signal output from the drive circuit 100 is subjected to pre-emphasis that differs from that of the drive circuit 100 depicted in FIG. 1. For example, as depicted in the example of FIG. 6A, if the duty cycle of the drive signal 620 is adjusted to be higher and the timings of the rising edges of the drive signal 610 and of the drive signal 620 are made to coincide, the drive signal 630 becomes a drive signal in which the falling edge 632 is controlled.

Figure 17:
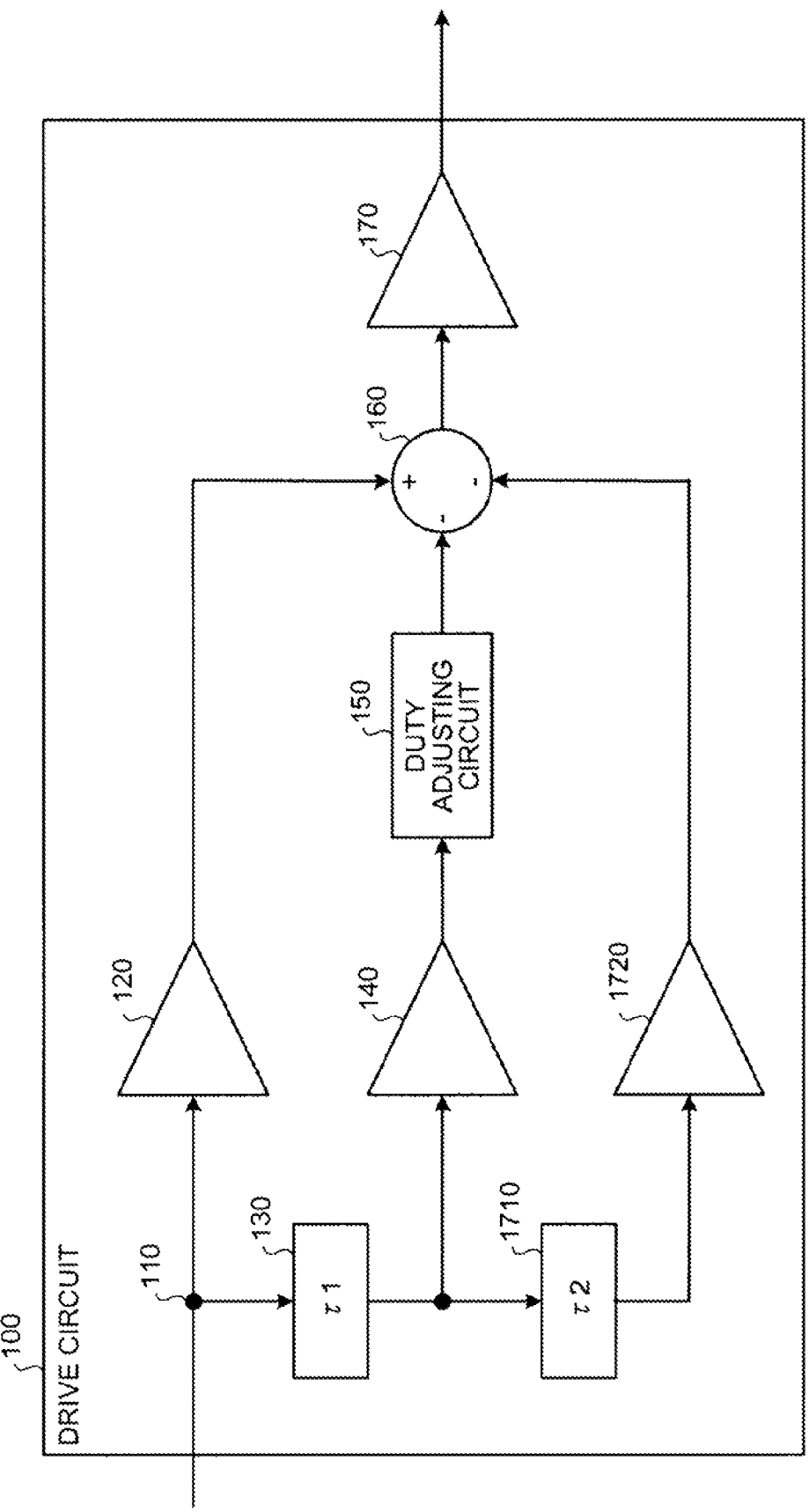
FIG. 17 is a fourth example of modification of the drive circuit.

FIG. 17 is a fourth example of modification of the drive circuit. In FIG. 17, components identical to those depicted in FIG. 1 are given the same reference numerals used in FIG. 1 and description thereof is omitted. As depicted in FIG. 17, the drive circuit 100 may include a delay circuit 1710 and an amplifier 1720 in addition to the configuration depicted in FIG. 1. The delay circuit 130 delays the drive signal output from the splitter 110 by a delay of τ1 and outputs the delayed drive signal to the amplifier 140 and the delay circuit 1710.

The delay circuit 1710 delays the drive signal output from the delay circuit 130 by a delay of τ2. The delay τ2 may be equivalent to the delay τ1 or may differ. The delay circuit 1710 outputs the delayed drive signal to the amplifier 1720. The amplifier 1720 adjusts the strength of the drive signal output from the delay circuit 1710 and outputs the adjusted drive signal to the subtractor 160. The subtractor 160 subtracts the drive signal output from the amplifier 120 from the drive signals output from the duty adjusting circuit 150 and the amplifier 1720.

In this manner, configuration may be such that the drive signal input to the drive circuit 100 is branched into 3, where each branch of the drive signal is delayed by a different amount. Further, although not depicted, configuration may be such that the drive signal input to the drive circuit 100 is branched into 4, where each branch of the drive signal is delayed by a different amount. As a result, pre-emphasis of the drive signal can be performed flexibly. In this case as well, by changing at least one of the duty cycles of the branches of the drive signal, asymmetrical pre-emphasis can be implemented.

Although the drive circuit 100 depicted in FIG. 1 has been described as modification examples in FIGS. 14 to 17, the drive circuit 100 may be of the respective configurations depicted in FIGS. 14 to 17. Further, in the drive circuit 100, any of the amplifiers 120, 140, and 170 may be omitted from the configuration.

Adjustment of delay difference and duty cycle difference in the drive circuit 100 will be described. For example, the adjuster (e.g., user) of the drive circuit 100 connects to the optical transmission apparatus 200, a measuring instrument that measures the optical signal output from the light emitting device 210 and obtains by measurement, the waveform 510 (for example, refer to FIG. 5A) and the eye pattern 520 (for example, refer to FIG. 5B) of the optical signal.

Next, the user adjusts the delay difference and the duty difference occurring in the drive circuit 100 so that the waveform 510 and the eye pattern 520 of the optical signal become a desired shape. For example, the adjuster performs adjustment such that the rising edge and the falling edge of the waveform 510 and of the eye pattern 520 become symmetrical, enabling improvement of the transmission characteristic of the optical signal.

For example, in the drive circuit 100 depicted in FIG. 1, the adjuster adjusts the delay τ1 in the delay circuit 130 and adjusts the duty cycle in the duty adjusting circuit 150. The adjustment of the duty cycle, for example, can be performed by varying the value of the currents of the variable power sources 931 and 951 depicted in FIG. 9 or of the variable power sources 1141 and 1142 depicted in FIG. 11.

Consequently, according to the characteristics of the light emitting device 210, the adjuster corrects (pre-emphasizes)

the rising edge and the falling edge of the drive signal input to the light emitting device 210, enabling improvement of the transmission characteristics of the optical signal output from the light emitting device 210.

In this manner, according to the drive circuit of the embodiment 100, by inducing delay difference and duty cycle difference on the branches of the drive signal and performing addition or subtraction, asymmetrical pre-emphasis of asymmetrically correcting the rising edge and the falling edge can be easily implemented by a simple configuration. Therefore, compared to conventional technologies, circuit scale is reduced (for example, the number of transistors is reduced), parasitic gate capacitance is reduced, and high-speed operation can be achieved.

Further, according to the drive circuit 100, by reducing circuit scale, power consumption can be reduced. Since the drive circuit 100 enables a simple configuration, even if the drive signal is of a high-speed, timing adjustment within the circuit is easy, enabling high-speed operation. Although an example where the drive circuit 100 is used for shaping the drive signal of the light emitting device 21, the drive circuit 100 may be used to shape the drive signal of a device other than a light emitting device.

As described, according to the drive circuit, the optical transmission apparatus, the driving method, and the optical transmission method, high-speed operation is enabled.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A drive circuit for generating a pre-emphasized signal, comprising:
   a splitter that splits an input signal into a first signal and a second signal each of which has a first duty cycle;
   a calculator that subtracts one of the first signal and the second signal from the other signal, or adds the first signal to the second signal;
   a first duty cycle adjusting circuit that is arranged between the splitter and the calculator and changes the first duty cycle of the first signal such that the first signal has a second duty cycle that differs from the first duty cycle of the second signal and the first signal has a frequency same as a frequency of the input signal; and
   a first delay circuit that is arranged between the splitter and the calculator and causes the first signal and the second signal to have differing phases.

2. The drive circuit according to claim 1, further comprising:
   a second duty cycle adjusting circuit that is arranged between the splitter and the calculator and changes the first duty cycle of the second signal; and
   a second delay circuit that is arranged between the splitter and the calculator and adds a delay to the second signal, wherein
   the first delay circuit adds a delay to the first signal.

3. The drive circuit according to claim 1, further comprising an amplifier or attenuator, wherein the amplifier or the attenuator causes the first signal and the second signal to have differing amplitudes.

4. The drive circuit according to claim 1, wherein the first delay circuit causes the first signal and the second signal to have a variable delay difference.

5. The drive circuit according to claim 4, wherein the first delay circuit changes the delay difference consequent to an adjuster operation.

6. The drive circuit according to claim 4, wherein the delay difference causes rising edge timings of the first signal and rising edge timings of the second signal to coincide.

7. The drive circuit according to claim 1, wherein the first duty cycle adjusting circuit causes the first signal and the second signal to have a variable duty cycle difference.

8. The drive circuit according to claim 7, wherein the first duty cycle adjusting circuit changes the duty cycle difference consequent to an adjuster operation.

9. The drive circuit according to claim 1, wherein the first duty cycle adjusting circuit changes a threshold for switching on and off any one among the first signal and the second signal to change the duty cycle difference.

10. The drive circuit according to claim 1, wherein
    the first signal and the second signal are a differential signal pair, and
    the first duty cycle adjusting circuit gives direct current offset to the first signal and/or the second signal to change the duty cycle difference.

11. The drive circuit according to claim 1, wherein the input signal is a drive signal of a light emitting device.

12. An optical transmission apparatus for generating a pre-emphasized signal, comprising:
    a splitter that splits an input signal into a first signal and a second signal each of which has a first duty cycle;
    a calculator that subtracts one of the first signal and the second signal from the other signal, or adds the first signal to the second signal;
    a first duty cycle adjusting circuit that is arranged between the splitter and the calculator and changes the first duty cycle of the first signal such that the first signal has a second duty cycle that differs from the first duty cycle of the second signal and the first signal has a frequency same as a frequency of the input signal;
    a first delay circuit that is arranged between the splitter and the calculator and causes the first signal and the second signal to have differing phases; and
    a light emitting device that outputs an optical signal that is based on a signal resulting from the calculator.

13. A driving method for a drive circuit to generate a pre-emphasized signal, comprising:
    splitting an input signal into a first signal and a second signal each of which has a first duty cycle;
    changing the first duty cycle of the first signal such that the first signal has a second duty cycle that differs from the first duty cycle of the second signal and the first signal has a freauencv same as a freauencv of the input signal;
    causing the first signal and the second signal to have differing phases; and
    performing subtraction by subtracting one of the first signal and the second signal from the other signal, or addition of the first signal and the second signal.

14. An optical transmission method for an optical transmission apparatus to generate a pre-emphasized signal, comprising:
    splitting an input signal into a first signal and a second signal each of which has a first duty cycle;
    changing the first duty cycle of the first signal such that the first signal has a second duty cycle that differs from the duty cycle of the second signal and the first signal has a frequency same as a frequency of the input signal;

causing the first signal and the second signal to have differing phases;

performing subtraction by subtracting one of the first signal and the second signal from the other signal, or addition of the first signal and the second signal; and outputting an optical signal that is based on a signal resulting from the subtraction or the addition.

* * * * *